(12) United States Patent
Yamahira et al.

(10) Patent No.: US 10,879,782 B2
(45) Date of Patent: Dec. 29, 2020

(54) SEMICONDUCTOR DEVICE HAVING SWITCHING ELEMENT SUPPRESSING POTENTIAL VARIATION

(71) Applicant: DENSO CORPORATION, Kariya (JP)

(72) Inventors: Yuu Yamahira, Kariya (JP); Tetsuya Matsuoka, Kariya (JP)

(73) Assignee: DENSO CORPORATION, Kariya (JP)

( * ) Notice: Subject to any disclaimer, the term of this patent is extended or adjusted under 35 U.S.C. 154(b) by 65 days.

(21) Appl. No.: 15/666,890

(22) Filed: Aug. 2, 2017

(65) Prior Publication Data

US 2018/0041107 A1    Feb. 8, 2018

(30) Foreign Application Priority Data

Aug. 5, 2016 (JP) .................. 2016-154865

(51) Int. Cl.
*H02M 1/08* (2006.01)
*H03K 17/567* (2006.01)
(Continued)

(52) U.S. Cl.
CPC .......... *H02M 1/08* (2013.01); *H01L 23/4012* (2013.01); *H01L 23/473* (2013.01); *H01L 25/07* (2013.01); *H01L 25/071* (2013.01); *H02M 7/003* (2013.01); *H02M 7/537* (2013.01); *H03K 17/14* (2013.01); *H03K 17/567* (2013.01); *H05K 7/209* (2013.01); *H05K 7/20927* (2013.01); *H01L 2224/33* (2013.01); *H01L 2224/40137* (2013.01); *H01L 2224/48247* (2013.01);
(Continued)

(58) Field of Classification Search
None
See application file for complete search history.

(56) References Cited

U.S. PATENT DOCUMENTS

| 2003/0022464 | A1 | 1/2003 | Hirano et al. |
| 2007/0252169 | A1* | 11/2007 | Tokuyama ............ H02M 7/003 |
| | | | 257/162 |
| 2009/0057832 | A1 | 3/2009 | Kouno |
| 2009/0201708 | A1* | 8/2009 | Ohkouchi ............... H01L 25/18 |
| | | | 363/132 |
| 2011/0057713 | A1 | 3/2011 | Kawanami et al. |
| 2012/0025264 | A1 | 2/2012 | Kouno |

(Continued)

FOREIGN PATENT DOCUMENTS

| JP | H05-206449 A | 8/1993 |
| JP | 2001-156219 A | 6/2001 |

(Continued)

*Primary Examiner* — Nicholas J Tobergte
*Assistant Examiner* — Kien C Ly
(74) *Attorney, Agent, or Firm* — Oliff PLC

(57) ABSTRACT

The semiconductor device is provided with a plurality of switching elements connected in parallel to each other, and a plurality of recirculation element connected in parallel to the aforementioned plurality of switching elements. An emitter electrode serves as a reference potential of the aforementioned plurality of switching elements and an anode electrode serves as a reference potential of the aforementioned plurality of recirculation elements are electrically connected by the same plate-like member consisting of a conductive material. The aforementioned switching elements and the aforementioned recirculation elements which are connected in parallel on the lowest potential side are constituted so that the distance from the emitter terminal connected to the aforementioned emitter electrode to the aforementioned recirculation element becomes no greater than the distance from the aforementioned emitter terminal.

15 Claims, 24 Drawing Sheets

(51) Int. Cl.
*H02M 7/537* (2006.01)
*H02M 7/00* (2006.01)
*H05K 7/20* (2006.01)
*H01L 25/07* (2006.01)
*H03K 17/14* (2006.01)
*H01L 23/473* (2006.01)
*H01L 23/40* (2006.01)
*H02M 1/00* (2006.01)
*H02P 27/06* (2006.01)

(52) U.S. Cl.
CPC ............... *H01L 2224/73265* (2013.01); *H01L 2924/181* (2013.01); *H02M 2001/0054* (2013.01); *H02P 27/06* (2013.01)

(56) References Cited

U.S. PATENT DOCUMENTS

| | | | |
|---|---|---|---|
| 2013/0334567 | A1 | 12/2013 | Kouno |
| 2015/0028466 | A1* | 1/2015 | Kadoguchi ......... H01L 23/3107 257/676 |
| 2015/0123718 | A1 | 5/2015 | Kouno |
| 2017/0077044 | A1* | 3/2017 | Soyano ................. H01L 23/48 |

FOREIGN PATENT DOCUMENTS

| | | |
|---|---|---|
| JP | 2003-243608 A | 8/2003 |
| JP | 2006-324595 A | 11/2006 |
| JP | 2013-080835 A | 5/2013 |
| JP | 2016-086491 A | 5/2016 |
| JP | 2017-005089 A | 1/2017 |

\* cited by examiner

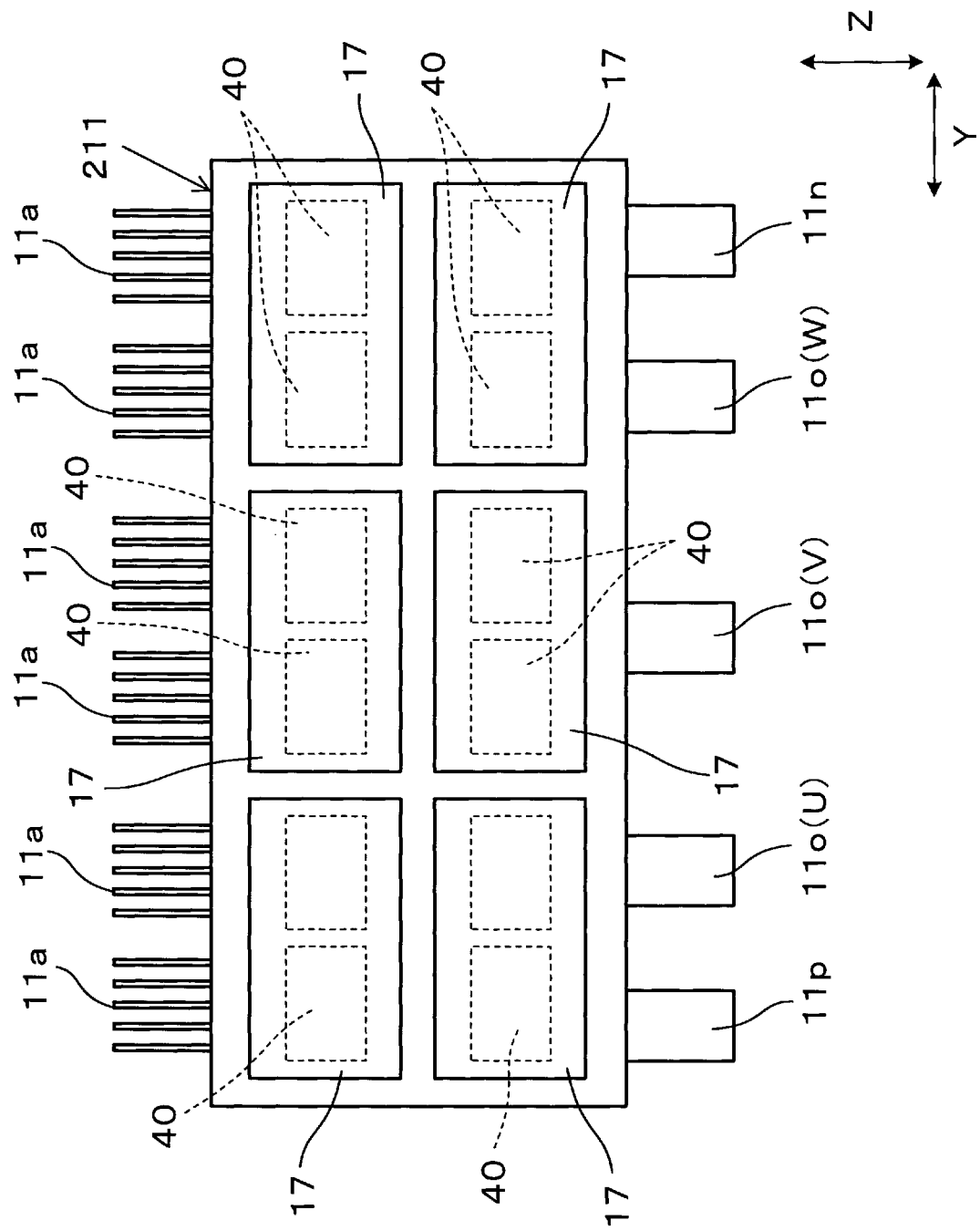

SEMICONDUCTOR DEVICE HAVING SWITCHING ELEMENT SUPPRESSING POTENTIAL VARIATION

CROSS-REFERENCE TO RELATED APPLICATION

This application is based on and claims the benefit of priority from earlier Japanese Patent Application No. 2016-154865 filed Aug. 5, 2016, the description of which is incorporated herein by reference.

BACKGROUND OF THE INVENTION

Technical Field

The present disclosure relates to a semiconductor device in which a plurality of switching elements are connected in parallel.

Description of the Related Art

Semiconductor devices having a plurality of switching elements connected in parallel are known.

An example of the semiconductor device is disclosed in, for example, JP-A 2003-110064. The semiconductor device is provided with switching elements constituted by an Insulated Gate Bipolar Transistor (IGBT).

Recently, in response to requests for high output semiconductor devices, the configuration in which a plurality of switching elements were connected in parallel to each other, and a diode which is a recirculation element is inversely connected in parallel to the switching elements has been used. In the configuration, a recovery current flows from a collector terminal to an emitter terminal during the recovery period of the recirculation element. At this time, current flows to the emitter line of the switching elements so that a potential difference, i.e., an emitter potential difference is produced. The emitter potential difference is expressed by the product of the inductance L of the emitter line and di/dt which is the change rate of the current during switching.

When the plurality of switching elements disclosed in, for example, the aforementioned PTL 1 are connected in parallel with each other, external wiring such as a bus bar has been used to form the emitter line. When using the external wiring, the emitter potential difference is likely to become high. Reasons for this include, the points that the external wiring itself becomes long and the inductance L is large, the energization amounts are different depending on the individual differences of the plurality of switching elements, and the time change rate di/dt of the current is large are provided.

Moreover, if the emitter potential difference becomes large and the potential of the emitter line, i.e., the reference potential of the gate potential greatly fluctuates, the gate potential of the switching elements is unstable which may cause a malfunction, etc., of the switching elements to occur.

SUMMARY

The present disclosure, in view of these problems, provides an effective technology to keep the fluctuations of the potential of the emitter line of the switching elements low in a semiconductor device in which a plurality of switching elements are connected in parallel.

An embodiment of the present disclosure is a semiconductor device comprising a plurality of switching elements connected in parallel to each other, and a plurality of recirculation elements connected in parallel to the aforementioned plurality of switching elements, characterized in that an emitter electrode serving as a reference potential of the aforementioned plurality of switching elements, and an anode electrode serving as a reference potential of the aforementioned plurality of recirculation elements are electrically connected by the same plate-like member consisting of a conductive material, and the aforementioned switching elements and the aforementioned recirculation element connected in parallel of the lowest potential side are constituted so that the distance from an emitter terminal connected to the aforementioned emitter electrode to the aforementioned recirculation element becomes no greater than the distance from the aforementioned emitter terminal to the aforementioned switching elements.

In the semiconductor device of the aforementioned embodiment, an emitter line which connects the emitter electrode of the switching elements with the anode electrode of the recirculation element is constituted by a plate-like member consisting of a conductive material. Since a plate-like member can shorten the path length compared to external wiring such as a bus bar, thus, the inductance is low. Therefore, even if the recovery current flows from a collector terminal to the emitter terminal during the recovery period of the recirculation element, the emitter potential difference generated in the emitter line can be kept low. Therefore, the gate potential of the switching elements can be stabilized by suppressing large fluctuations of the potential of the emitter line, and accordingly, the occurrence of malfunctions, etc., of the switching elements can be prevented. In this case, by keeping the inductance of the emitter line low, it is possible to increase the time change rate di/dt of the current, i.e., make the switching rate faster, and the loss reduction of the switching elements and chip size reduction can be ensured thereby.

Further, if constituted so that the distance from the emitter terminal to the recirculation element becomes no greater than the distance from the emitter terminal to the switching elements, the recirculation element can be arranged closer to the emitter terminal than the switching elements, or the recirculation element can set the separation distance for the emitter terminal in the same manner as the switching elements. In this case, the switching elements can be arranged in a position separated from the path of the recovery current which flows through the recirculation element to the emitter terminal during the recovery period of the recirculation element. Therefore, the effect of the recovery current can control the potential of the emitter line of the switching elements from fluctuating.

As stated above, according to the aforementioned embodiment, it is possible to keep the fluctuations of the potential of the emitter line of the switching elements low in the semiconductor device in which a plurality of switching elements are connected in parallel.

Note that, the reference numerals in parentheses described in the claims and the means for solving the problems indicate the corresponding relationship between the specific means described in the following embodiments, and do not limit the technical range of the present invention.

BRIEF DESCRIPTION OF DRAWINGS

FIG. 36 is a side view of the semiconductor device of a fourteenth embodiment.

DETAILED DESCRIPTION OF PREFERRED EMBODIMENTS

Figure 1:
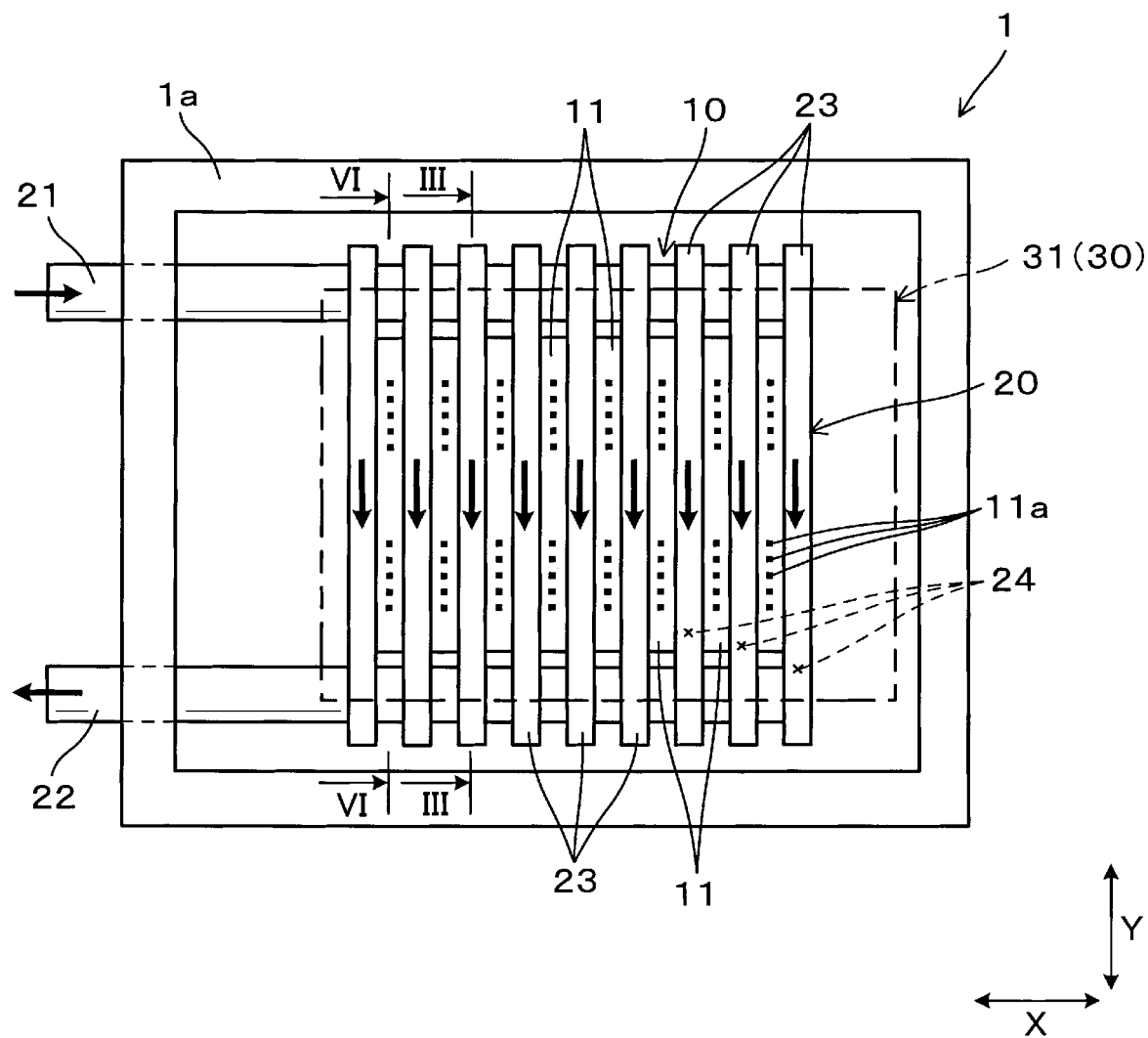
FIG. 1 is a plan view of a power conversion device provided with a semiconductor device of the first embodiment.

The embodiments according to the power conversion device will be explained below with reference to the drawings.

Note that, in the drawings of the disclosure, unless specifically stated, the first direction which is the thickness direction of the semiconductor device constituting the power conversion device is indicated with an arrow X, a second direction which is the lateral width direction of the semiconductor device is indicated with an arrow Y, and a third direction which is orthogonal to both the first direction and the second direction is indicated with an arrow Z.

The power conversion device according to the present embodiment is a device for performing power conversion. The semiconductor device constituting the power conversion device is mounted in, for example, an electric vehicle or a hybrid vehicle as an inverter for converting a DC power source power to AC power necessary to drive a drive motor, and further, can be used as a converter for converting the DC power to boosted or stepped-down DC power.

First Embodiment

Figure 2:
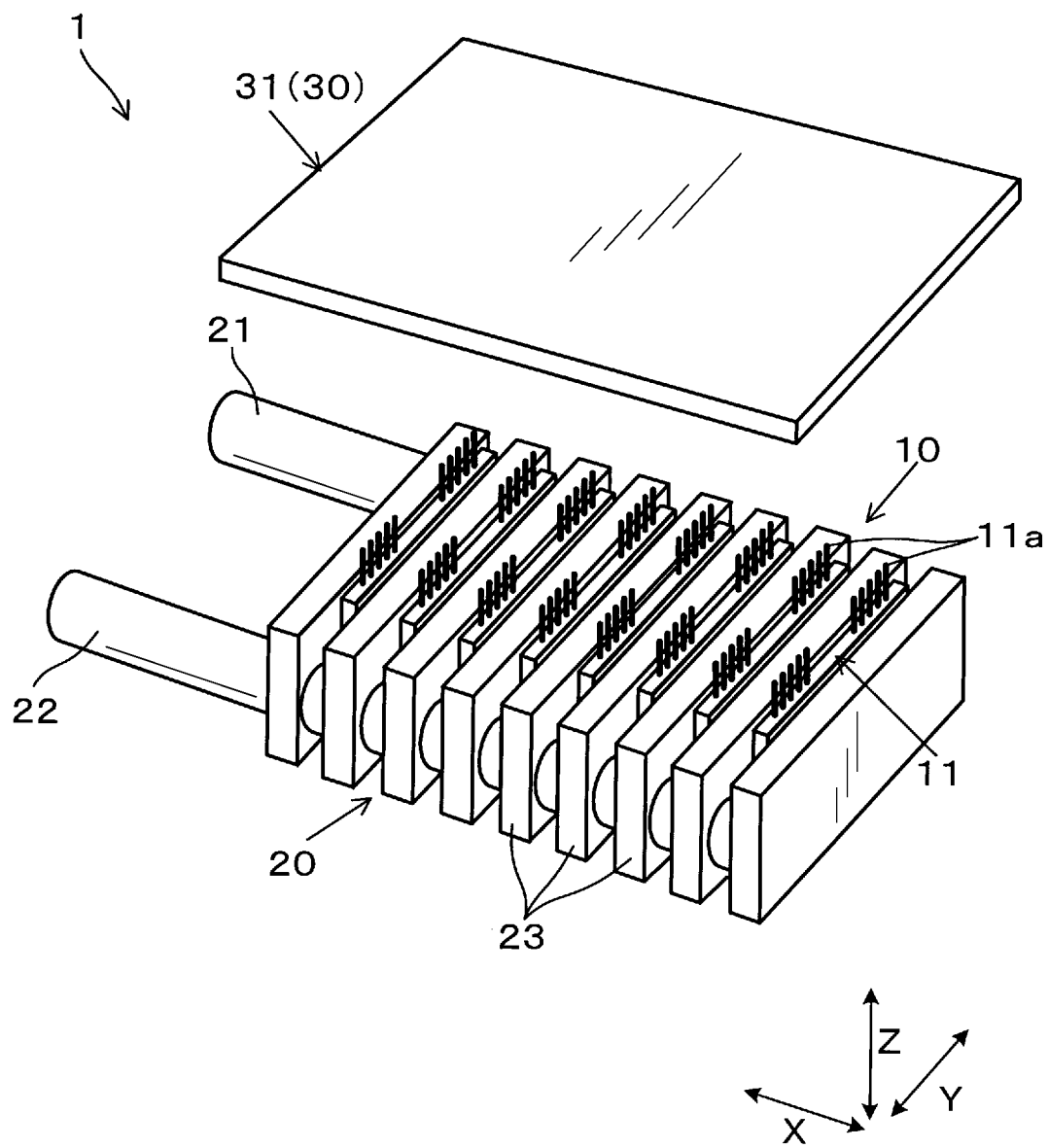
FIG. 2 is a perspective view of the power conversion device of FIG. 1.

As shown in FIGS. 1 and 2, the power conversion device 1 comprises a plurality of elements including a semiconductor lamination unit 10 and a control circuit board 31 of a control part 30. These plurality of elements are housed in a space partitioned by a case 1a. The case 1a is an automobile component that is lightweight and requires high dimensional accuracy and is made by aluminum die casting method using aluminum.

The semiconductor lamination unit 10 comprises a plurality of the semiconductor devices 11 of the first embodiment, and a cooler 20 for cooling these plurality of the semiconductor devices 11. FIGS. 1 and 2 show eight semiconductor devices 11.

The cooler 20 comprises an inflow pipe 21 extending in the first direction X, an outflow pipe 22 extending in the first direction X, a plurality of cooling pipes 23 extending in the second direction Y and arranged at a predetermined interval with regards to the first direction X. FIGS. 1 and 2 show nine cooling pipes 23.

In the semiconductor lamination unit 10, the plurality of the semiconductor devices 11 and the plurality of cooling pipes 23 are alternately laminated in the first direction X. In this case, each semiconductor device 11 is sandwiched from both sides by the two cooling pipes 23,23.

The plurality of control terminals 11a of the semiconductor device 11 are electrically connected to the control circuit board 31. The control current for controlling the switching operation of the semiconductor device 11 passes through these plurality of the control terminals 11a from the control circuit board 31 to be input in the semiconductor device 11.

In the cooler 20, the respective inlet portions of the plurality of cooling pipes 23 are connected to the inflow pipe 21, and the respective outlet portions of the plurality of cooling pipes 23 are connected to outflow pipe 22. Further, the cooling pipes 23 have a coolant flow path 24 in the pipes. Therefore, the coolant flowing into the inlet portion of the cooling pipes 23 from the inflow pipe 21 cools the semiconductor device 11 abutting against the cooling pipes 23 while flowing through the coolant flow path 24 in the cooling pipes 23, and then is discharged from the outlet portion of the cooling pipes 23 to the outflow pipe 22.

The cooler 20 is made of a material having excellent thermal conductivity such as aluminum.

Figure 3:
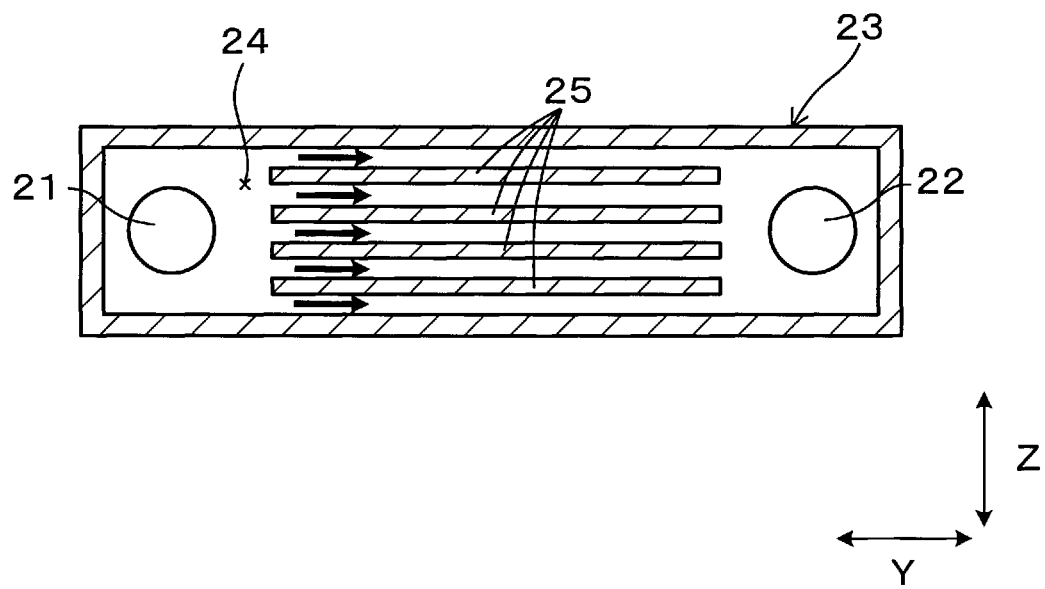
FIG. 3 is a sectional view taken along arrows of FIG. 1.
Figure 4:
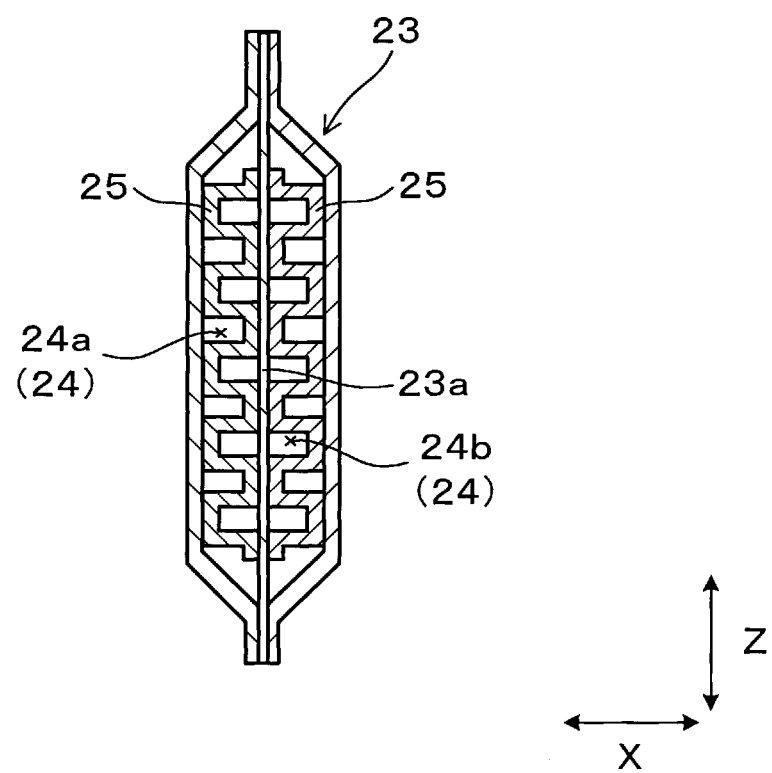
FIG. 4 is a sectional view of a plane defined by the first direction and the third direction of the cooling pipes in FIG. 1.

As shown in FIGS. 3 and 4, the cooling pipes 23 are provided with a partition member 23a which partitions the coolant flow path 24 in the pipes into two spaces 24a,24b with regards to the first direction X. A radiation fin 25 extending in a direction that intersects with the flow direction of the coolant in the coolant flow path 24 is provided in the two respective spaces 24a,24b. The radiation fin 25 has an effect which increases the heat exchange efficiency by increasing the contact area with the coolant and improves the cooling performance. Specifically, when the radiation fin 25 extends in the direction perpendicular to the flow direction of the coolant in the coolant flow path 24, the effect of improving the cooling performance is high.

Note that, for example, natural coolants such as water and ammonia, water mixed with an anti-freeze such as ethylene glycol, or a fluorocarbon coolant such as fluorinert, or a chlorofluorocarbon coolant such as HCFC 123 and HFC 134a, an alcohol-based coolant such as methanol and alcohol, or a ketone-based coolant such as acetone can be used as the coolant flowing in the coolant flow path 24 of the cooling pipes 23.

Figure 5:
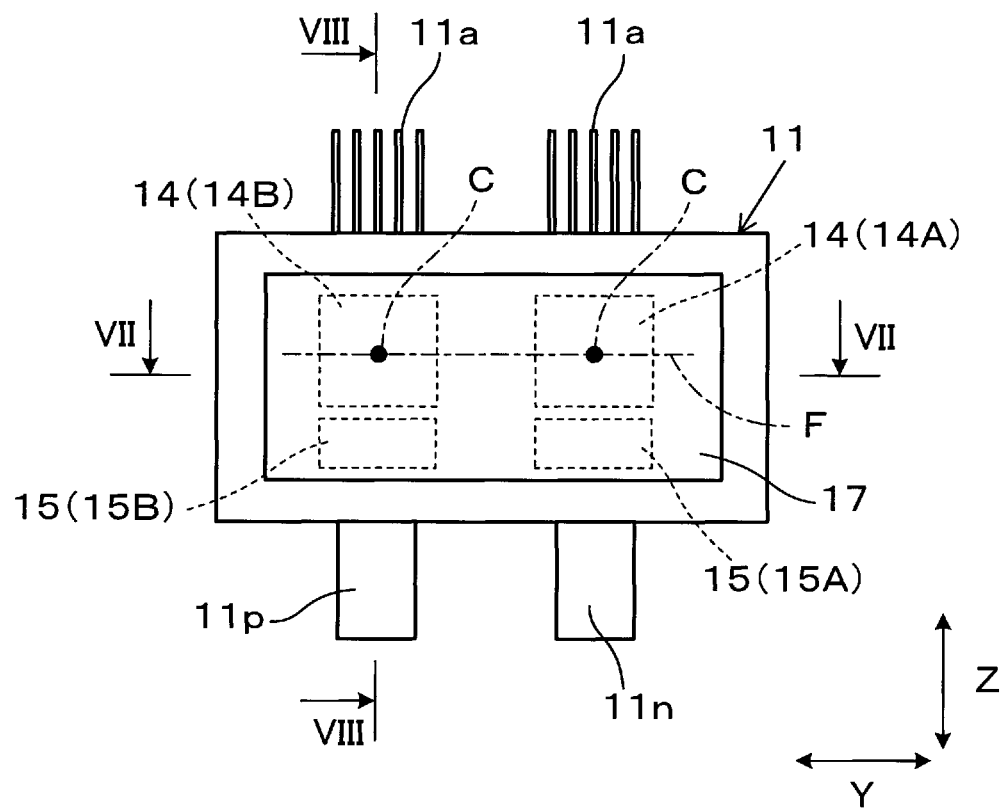
FIG. 5 is a side view of the semiconductor device in FIG. 1.

As shown in FIG. 5, the semiconductor device 11 is provided with two switching elements 14,14 connected in parallel to each other, and two recirculation elements 15,15. The semiconductor device 11 is constituted as one semiconductor module in which all of the two switching elements 14,14 and the two recirculation elements 15,15 are integrated. Specifically, the semiconductor device 11 is a semiconductor module provided with, one semiconductor element pair consisting of the two switching elements 14,14, and is referred to as the "1in1 module".

The switching element 14 is constituted as an insulated gate bipolar transistor for performing the switching operation during power conversion. The switching element 14 may be referred to as an "Insulated Gate Bipolar Transistor (IGBT)". The switching operation of the switching element 14 is controlled by a control part 30.

Note that, while not specifically shown, the switching element 14 is surrounded by one guard ring, and the element partitioned by the guard ring is defined as one element. Therefore, even when the switching element surrounded by the one guard ring has been further divided into a plurality of elements, the number of switching elements is one. In the case of the semiconductor device 11 of the present embodiment, the number of switching elements 14 is two.

The recirculation element 15 is constituted as a freewheel diode necessary for circulating the current so that there is no current in the direction opposite to the applied voltage flowing to the switching element 14 during switching. The recirculation element 15 can be referred to as a "Free Wheeling Diode (FWD)". One recirculation element 15 is inversely connected in parallel (hereinafter, simply referred to as the "connected in parallel to") to one switching element 14. Namely, the recirculation element 15 is connected in parallel to the switching element 14 so that the direction in which the current flows is opposite to that of switching element 14.

Figure 6:
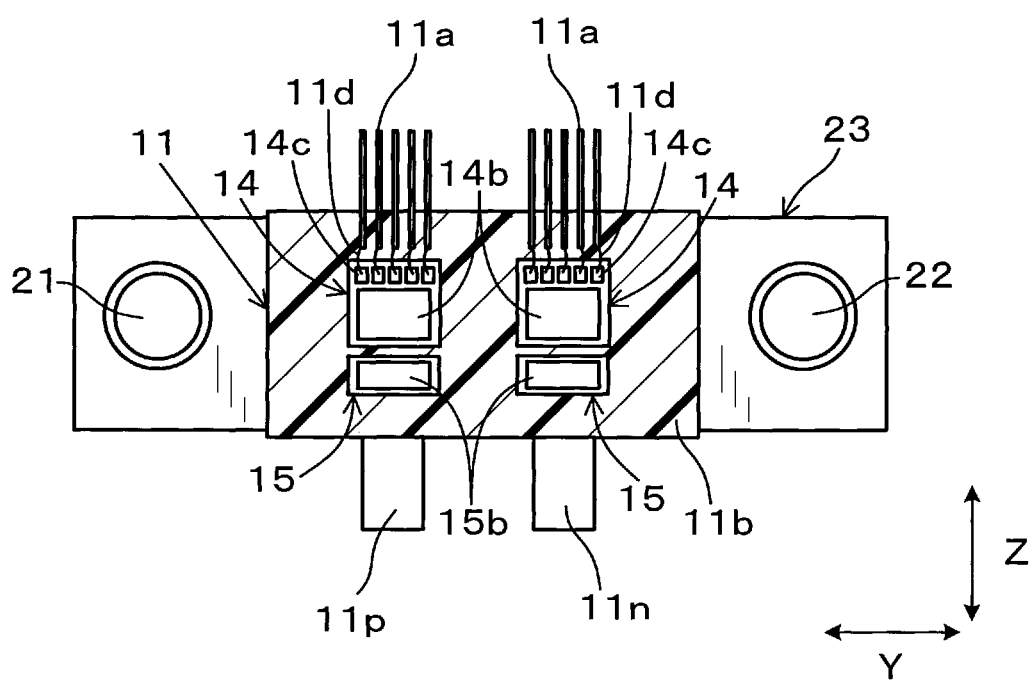
FIG. 6 is a sectional view taken along arrows VI-VI of FIG. 1.

As shown in FIG. 6, the semiconductor device 11 is molded by a mold resin 11b. Therefore, the two switching elements 14,14 and the two recirculation elements 15,15 are both embedded in the mold resin 11b. Therefore, two of each of the switching elements 14 and the recirculation elements 15 are sealed with resin to constitute one semiconductor module.

Figure 7:
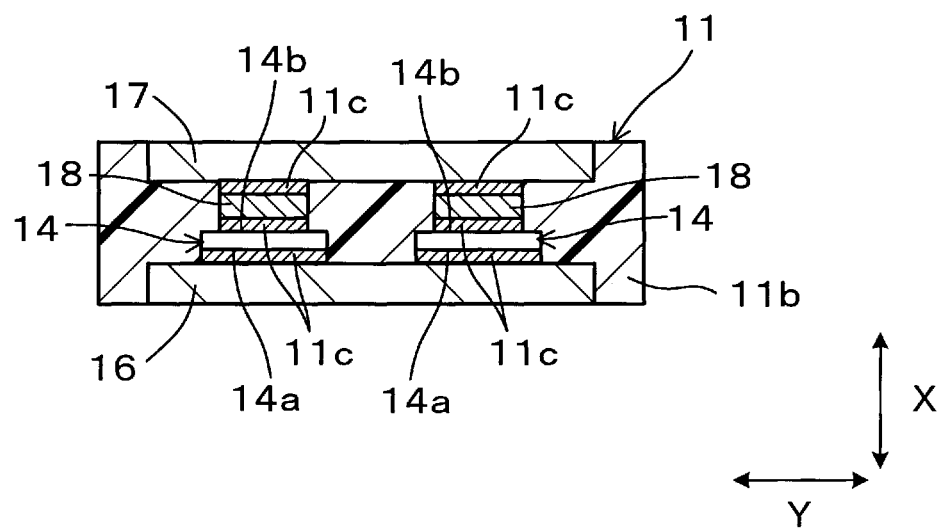
FIG. 7 is a sectional view taken along arrows VII-VII of FIG. 5.
Figure 8:
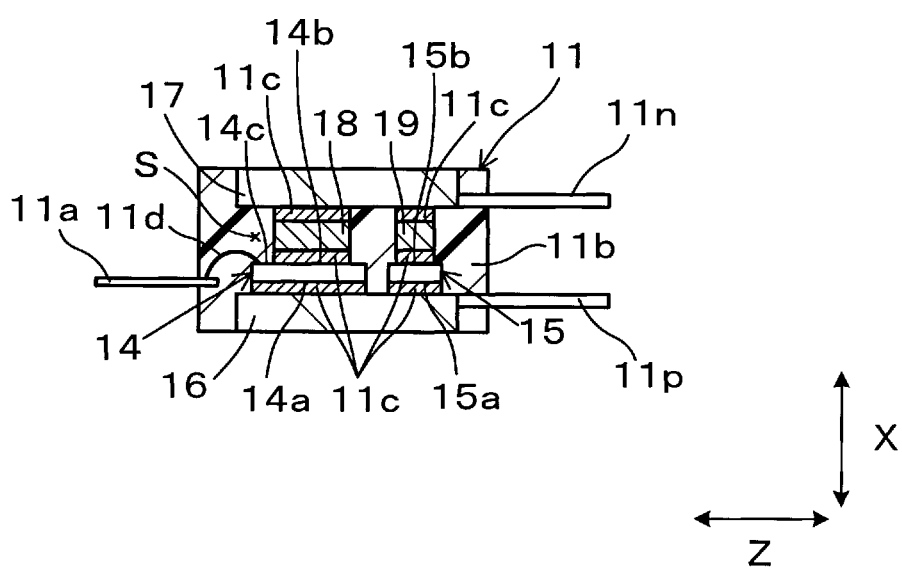
FIG. 8 is a sectional view taken along arrows VIII-VIII of FIG. 5.

With reference to FIGS. 6 to 8, the switching element 14 is a plate shape and is a rectangular, i.e., a square element in a plan view, comprises a collector electrode 14a on one of the element surfaces, and comprises an emitter electrode 14b and a gate electrode 14c on the other element surface. A heat sink 16 is joined to the collector electrode 14a of the switching element 14 via a solder layer 11c. A spacer 18 is joined to the emitter electrode 14b of the switching elements 14 via the solder layer 11c, and furthermore, a heat sink 17 is joined to the spacer 18 via the solder layer 11c. The emitter electrode 14b is an electrode which forms the reference potential of each switching element 14. The gate electrode 14c of the switching element 14 is connected to the control terminal 11a via a wire 11d as a connection line.

The recirculation element 15 has a plate shape and is a rectangular element in a plane view, comprises a cathode electrode 15a in one of the element surfaces, and comprises an anode electrode 15b in the other element surface. The heat sink 16 is joined to the cathode electrode 15a of the recirculation element 15 via the solder layer 11c. The spacer 19 is joined to the anode electrode 15b of the recirculation element 15 via the solder layer 11c, and furthermore, the heat sink 17 is joined to the spacer 19 via the solder layer 11c. The anode electrode 15b is an electrode serving as the reference potential of each anode electrode 15b.

Both of the heat sinks 16,17 are provided for each of the two switching elements 14,14 and the two recirculation elements 15,15. These heat sinks 16,17 are plate-like members consisting of a conductive material, and are preferably constituted by a copper alloy material, an iron alloy material, or other alloy materials of which the mechanical strength, the electrical conductivity, the thermal conductivity, the corrosion resistance and the like are excellent. While not specifically shown, the outer surfaces of the respective heat sinks 16,17 abut against the cooling pipes 23 of the cooler 20 via an insulating member. Therefore, the outer surfaces of both of the heat sinks 16,17, i.e., the contact surfaces with the cooling pipes 23 are constituted as a heat radiation surface for radiating the heat generated by the semiconductor device 11 to the coolant of the cooler 20.

With reference to FIGS. 5 and 8, the semiconductor device 11 is provided with a collector terminal 11p as the power terminal and an emitter terminal 11n. The collector terminal 11p is a terminal electrically connected to the collector electrode 14a of the switching element 14 via the heat sink 16. The emitter terminal 11n is the emitter terminal connected to the emitter electrode 14b of the switching element 14 via the heat sink 17. A DC voltage is applied to the semiconductor device 11 via the collector terminal 11p and the emitter terminal 11n.

The two switching elements 14,14 and the two recirculation elements 15,15 are arranged in a plane in a virtual plane (the virtual plane including the direction in which the collector terminal 11p extends) including the direction in which the emitter terminal 11n extends.

The spacer 18 is constituted as a conductive plate-like member interposed between the switching element 14 and the heat sink 17. The spacer 18 is constituted so as to electrically connect the switching element 14 with the heat sink 17, and to form a space S for extracting the wire 11d from the gate electrode 14c of the switching element 14. Therefore, the gate electrode 14c of the switching element 14 is electrically connected to the control part 30 via the wire 11d and the control terminal 11a.

The spacer 19 is constituted as a conductive plate-like member interposed between the recirculation element 15 and the heat sink 17. The spacer 19 is constituted so as to electrically connect the recirculation element 15 with the heat sink 17.

As shown in FIG. 5, the semiconductor device 11 is constituted so that, when the semiconductor device 11 is viewed from the heat sink 17 side, the aforementioned collector terminal 11p and the emitter terminal 11n both extend to the side opposite to the switching element 14, i.e., in the third direction Z from the recirculation element 15 side.

Specifically, as shown in FIG. 8, the collector terminal 11p extends in the third direction Z from a part closer to the recirculation element 15 than the switching element 14 in the heat sink 16. In this case, the collector electrode 14a of the switching elements 14 and the cathode electrode 15a of the recirculation element 15 are electrically connected by the heat sink 16 which is the same plate-like member.

On the one hand, the emitter terminal 11n extends in the third direction Z from the part closer to the recirculation element 15 than the switching element 14 in the heat sink 17. In this case, the emitter electrode 14b of the switching element 14 and the anode electrode 15b of the recirculation element 15 are electrically connected by the heat sink 17 which is the same plate-like member. Further, as shown in FIG. 7, the two switching elements 14,14 are arranged adjacent to each other along the plate surface of the heat sink 17.

In the case of a configuration which arranges a plurality of switching elements 14 of the same heat sink 17, the heat generated by the switching element 14 is concentrated in the heat sink 17, thus, cooling the heat sink 17 such as in the embodiment via the cooling pipes 23 of the cooler 20 is effective against the generation of heat in the switching element 14. Specifically, the heat sinks 16,17 constituting both surfaces of the semiconductor device 11 are preferably cooled via the cooling pipes 23 of the cooler 20. Therefore, it is possible to reduce the potential resistance by keeping the temperature of the switching element 14 low.

With reference to FIG. 5, the semiconductor device 11 of the present embodiment is constituted with regards to one switching element 14A and one recirculation element 15A connected in parallel, so that the distance from the emitter terminal 11n to the recirculation element 15A is less than the distance from the emitter terminal 11n to the switching elements 14A. Namely, the recirculation element 15A is closer to the emitter terminal 11n than the switching element 14A.

Similarly, regarding the other switching element 14B and the other recirculation element 15B connected in parallel, the distance from the emitter terminal 11n to the recirculation element 15B is constituted in order to be less than the distance from the emitter terminal 11n to the switching element 14B. Namely, the recirculation element 15B is closer to the emitter terminal 11n than the switching element 14B.

Note that, in the case of a 1in1 module, the switching element 14A and the recirculation element 15A (hereinafter, referred to as the "first parallel connection body") connected in parallel and the switching element 1B and the recirculation element 15B (hereinafter, referred to as the "second parallel connection body") connected in parallel have the same potential. Namely, there is no distinction of high or low regarding the potential of the first parallel connection body and the potential of the second parallel connection body. Therefore, the case of the first embodiment, as stated above, both the first parallel connection body and the second parallel connection body correspond to the condition of "with regards to the switching elements and the recirculation elements connected in parallel on the lowest potential side among the resin-sealed semiconductor modules, the distance to the recirculation element from the emitter terminal connected to the emitter electrode becomes no greater than the distance from the emitter terminal to the switching element".

Further, the two switching elements 14A,14B adjacent to each other are arranged in the semiconductor device 11 of the present embodiment so as to be arranged parallel to each other and an element center C of the switching element 14A and an element center C of the switching element 14B are positioned on the same virtual straight line F. The description "arranged parallel to each other" refers to a state in which the two switching elements 14A,14B are laterally or longitudinally arranged. In this case, the virtual straight line F extends in the second direction Y.

Therefore, it is possible to realize a regular arrangement pattern in which the two switching elements 14A,14B are symmetrically arranged with regards to the second direction Y. Note that the element center C is determined to be the position corresponding to the intersection of two diagonal lines among the switching elements having a rectangular shape. In this case, a diagonal line is defined as a line connecting the vertex of two non-adjacent corners.

According to the arrangement pattern, the recirculation elements 15A,15B are not interposed between the two switching elements 14A,14B, and the two switching elements 14A,14 are arranged on the same virtual straight line F, thus, the distance of the emitter line connecting the respective emitter electrodes can be kept short, and the inductance of the emitter line can be kept low.

Figure 9:
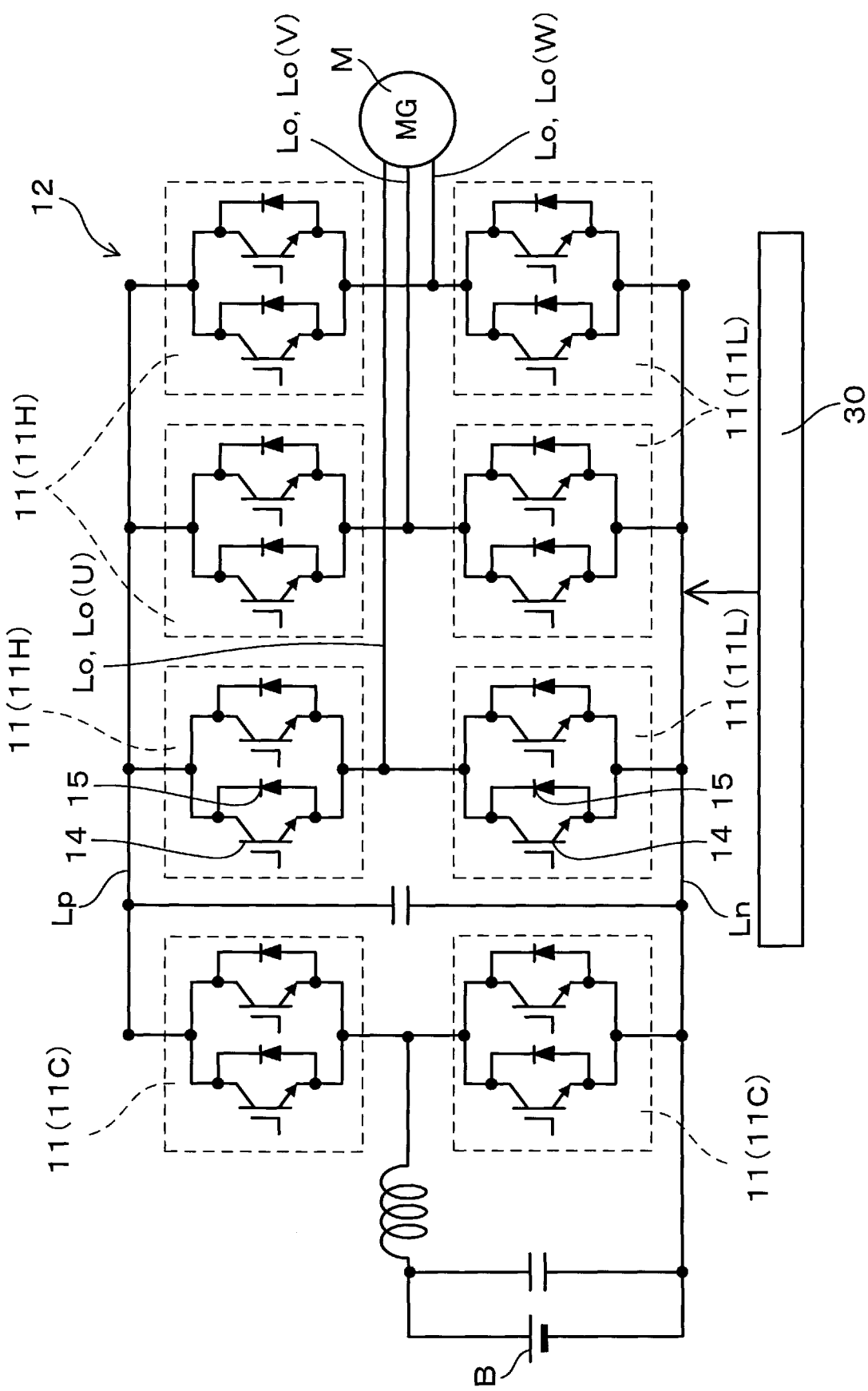
FIG. 9 is an inverter circuit diagram of the power conversion device of FIG. 1.

As shown in FIG. 9, the inverter circuit 12 of the power conversion device 1 of the aforementioned configuration is controlled by the control part 30. The eight semiconductor devices 11 constituting the inverter circuit 12 are classified as the two semiconductor devices 11C,11C constituting the boost circuit for boosting the voltage of a power source B, and the six semiconductor devices constituting a conversion circuit for converting the boosted DC power to AC power. The six semiconductor devices of the conversion circuit are further classified as the three upper arm semiconductor devices 11H connected to a high potential side line Lp of the power source B, and the three lower arm semiconductor devices 11L connected to a low potential side line Ln of the power source B.

Figure 10:
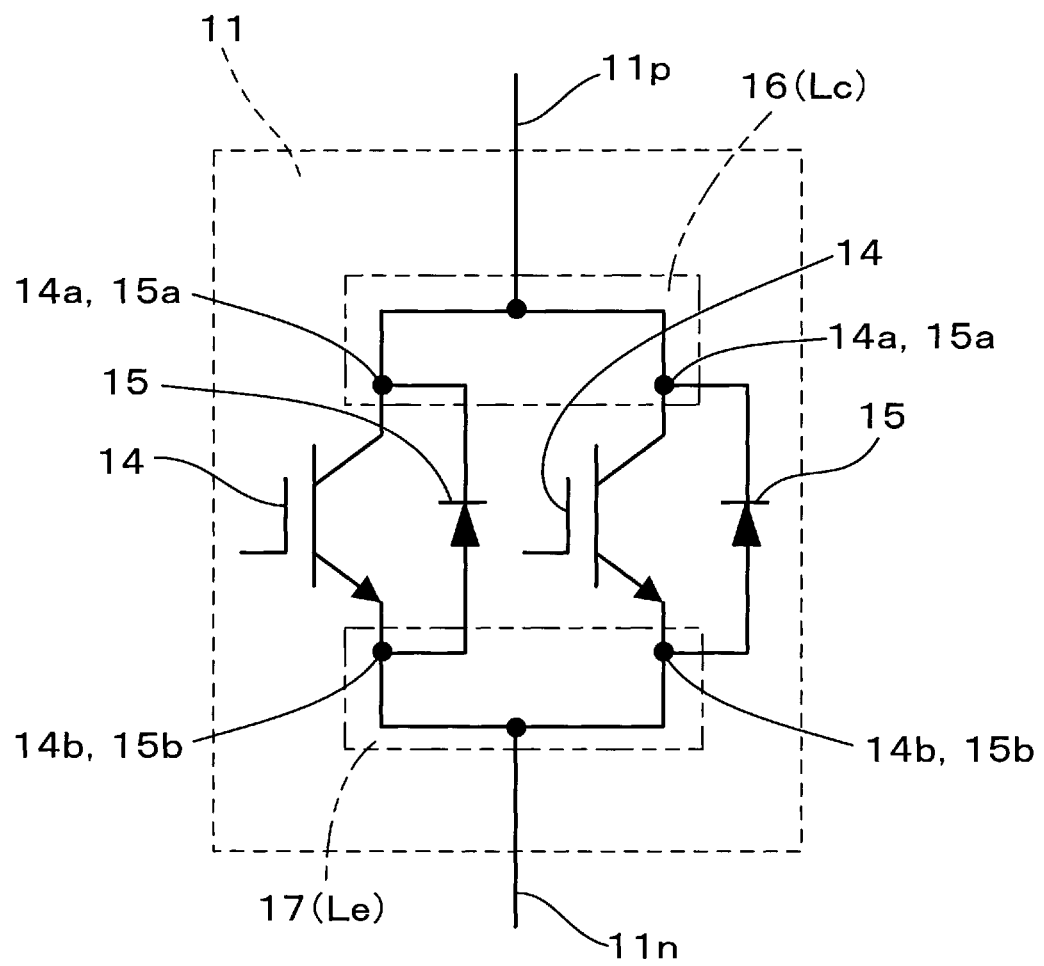
FIG. 10 is an equivalent circuit diagram of the semiconductor device in FIG. 9.

With reference to the equivalent circuit of FIG. 10, in the semiconductor device 11, two switching elements 14,14 are connected in parallel to each other, and one recirculation element 15 is connected in parallel to the respective two switching elements 14,14. In the equivalent circuit, a collector line Lc which electrically connects the collector electrode 14a of the switching element 14 with the cathode electrode 15a of the recirculation element 15 is constituted by the heat sink 16. Further, the emitter line Le which electrically connects the emitter electrode 14b of the switching element 14 with the anode electrode 15b of the recirculation element 15 is constituted by the heat sink 17. A three-phase AC motor for vehicle travel, i.e., the three-phase AC motor M in FIG. 9 is driven by the AC power obtained by the inverter circuit 12.

Note that, the collector line Lc may be constituted by a separate member than the heat sink 16 according to need. For example, the collector line Lc may be constituted by external wiring such as a bus bar.

Next, the operational effect of the semiconductor device 11 of the first embodiment will be explained.

In the semiconductor device 11 of the present embodiment, as stated above, the emitter line Le which connects the emitter electrode 14b of the switching element 14 with the anode electrode 15b of the recirculation element 15 is constituted by the heat sink 17. In this case, a plate-like member such as the heat sink 17 can shorten the path length compared to external wiring such as a bus bar, and accordingly, the inductance is low.

Therefore, even if the recovery current flows from the collector terminal 11p to the emitter terminal 11n during the recovery period of the recirculation element 15, the emitter potential difference generated in the emitter line Le can be kept low. The emitter potential difference is represented by the product of the inductance L of the emitter line and di/dt which is the change rate of the current during switching.

Therefore, the gate potential of the switching element 14 can be stabilized by suppressing the large fluctuations in the potential of the emitter line Le, and the generation of a malfunction, etc., of the switching element 14 can be prevented. In this case, by keeping the inductance L of the emitter line Le low, it is possible to make the time change rate di/dt of the current large, i.e., to make the switching speed fast, thus, the loss reduction of the switching element 14 and the reduction of the chip size can be ensured thereby.

Furthermore, with reference to FIG. 5, regarding the switching element 14A and the recirculation element 15A, the recirculation element 15A is located closer to the emitter terminal 11n than the switching element 14A. In this case, the switching element 14A can be arranged in a position separated from the path of the recovery current flowing through the recirculation element 15A to the emitter terminal 11n during the recovery period of the recirculation element 15A.

Similarly, regarding the switching element 14B and the recirculation element 15B, the recirculation element 15B is arranged closer to the emitter terminal 11n than the switching element 14B. In this case, the switching element 14B can be arranged in a position separated from the path of the recovery current flowing through the recirculation element 15B to the emitter terminal 11n during the recovery period of the recirculation element 15B.

Therefore, the potential of the emitter line Le of the switching elements 14A,14B can be controlled from fluctuating due to the effect of the recovery current.

Further, the function for electrically connecting the emitter electrode 14b of the switching elements and the anode electrode 15b of the recirculation element to the heat sink 17 having a heat radiation surface in the cooler 20 can also be performed. Therefore, it is possible to keep the number of parts of the semiconductor device 11 low and to simplify the structure.

Second Embodiment

Figure 11:
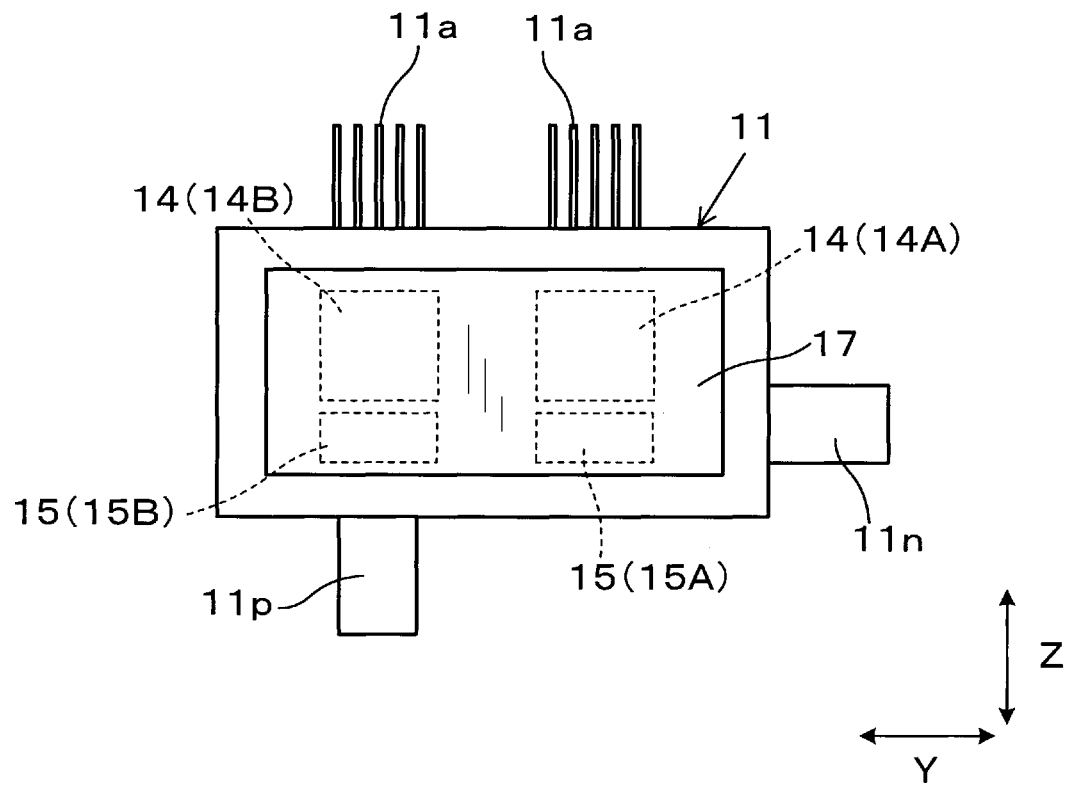
FIG. 11 is a side view of the semiconductor device of a second embodiment.

As shown in FIG. 11, the semiconductor device 11 of the second embodiment is different from the semiconductor device 11 of the first embodiment regarding the arrangement of the emitter terminal 11n.

In the second embodiment, the emitter terminal 11n of the semiconductor device 11 extends to one side of the heat sink 17, i.e., from the right side to the second direction Y in FIG. 11.

The semiconductor device 11 is constituted so that the distance from the emitter terminal 11n to the recirculation element 15A becomes no greater than the distance from the emitter terminal 11n to the switching elements 14A. Further, the semiconductor device 11 is constituted so that the distance from the emitter terminal 11n to the recirculation element 15B becomes no greater than the distance from the emitter terminal 11n to the switching element 14B.

The other configurations are the same as the first embodiment.

According to the second embodiment, even when the arrangement of the emitter terminal 11n is changed, the switching elements 14A,14B are unlikely to be affected by the recovery current flowing through the recirculation elements 15A,15B in the same manner as in the case of the first embodiment so that the emitter potential can be controlled from fluctuating.

In addition, the same operational effect as in the first embodiment is brought about.

Third Embodiment

Figure 12:
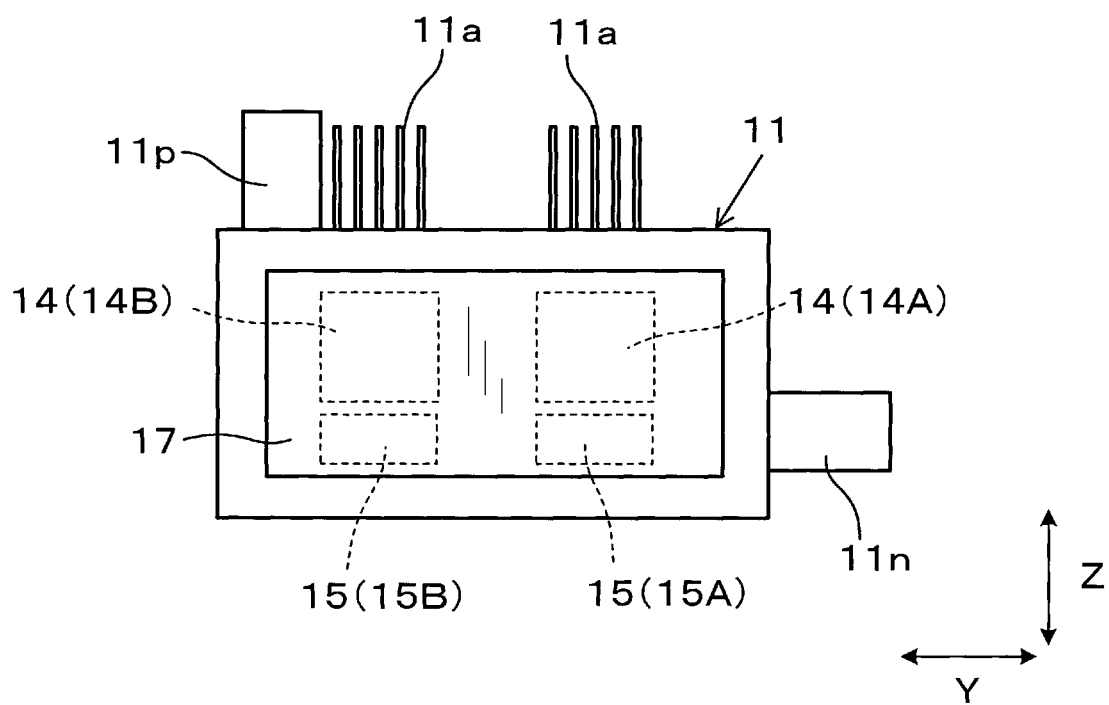
FIG. 12 is a side view of the semiconductor device of a third embodiment.

As shown in FIG. 12, the semiconductor device 11 of the third embodiment is different from the semiconductor device 11 of the first embodiment regarding the arrangement of both the collector terminal 11p and the emitter terminal 11n.

In the third embodiment, the collector terminal 11p of the semiconductor device 11 extends to one side of the heat sink 16, i.e., from the upper side in the third direction Z in FIG. 12. Further, the emitter terminal 11n extends to one side of the heat sink 17, i.e., from the right side to the second direction Y in FIG. 12.

The semiconductor device 11 is constituted so that the distance from the emitter terminal 11n to the recirculation element 15A becomes no greater than the distance from the emitter terminal 11n to the switching elements 14A. Further, the semiconductor device 11 is constituted so that the distance from the emitter terminal 11n to the recirculation element 15B becomes no greater than the distance from the emitter terminal 11n to the switching element 14B.

The other configurations are the same as the first embodiment.

According to the third embodiment, even when the collector terminal 11p and the emitter terminal 11n were changed, the switching elements 14A,14B are unlikely to be affected by the recovery current flowing through the recirculation elements 15A,15B in the same manner as in the case of the first embodiment so that the emitter potential can be controlled from fluctuating.

In addition, the same operational effect as in the first embodiment is brought about.

Fourth Embodiment

Figure 13:
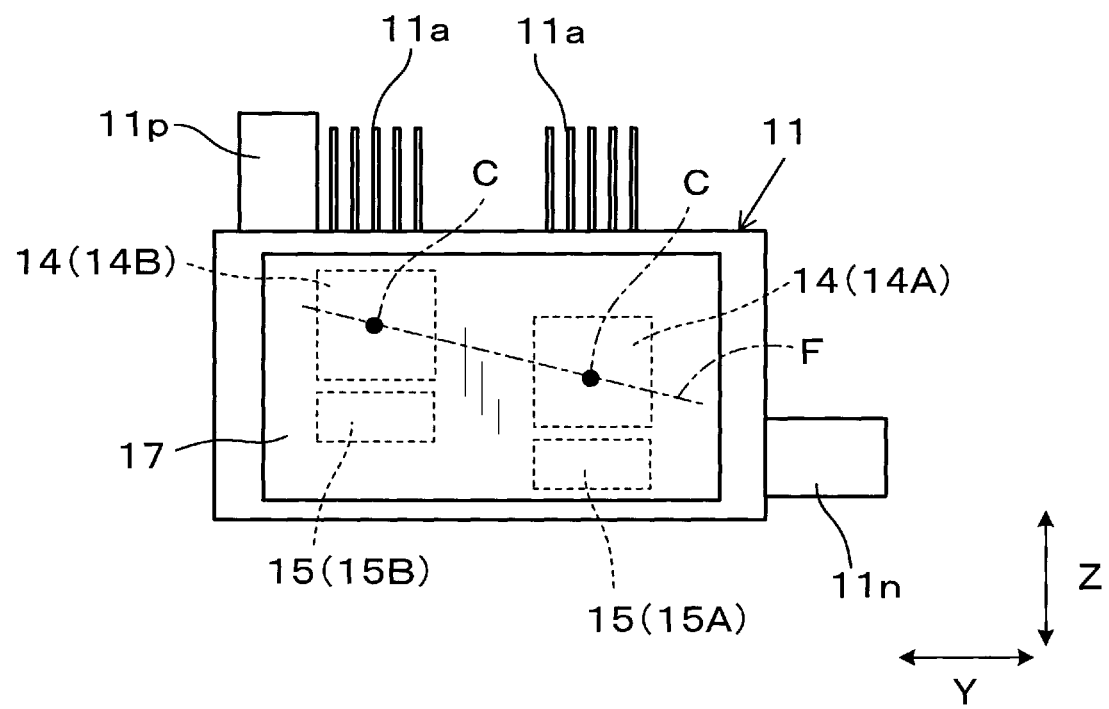
FIG. 13 is a side view of the semiconductor device of a fourth embodiment.

As shown in FIG. 13, the semiconductor device 11 of the fourth embodiment is different from the semiconductor device 11 of the first embodiment regarding the arrangement of both of the collector terminal 11p and the emitter terminal 11n, and regarding the relative position of the switching element 14A and the switching element 14B.

In the fourth embodiment, the same virtual straight line F passing through the element center C of the switching elements 14A and the element center C of the switching element 14B is constituted so as to extend across the second direction Y.

The other configurations are the same as the first embodiment.

According to the fourth embodiment, even when the arrangement of both the collector terminal 11p and the emitter terminal 11n, and the relative position of the switching elements 14A and the switching element 14B were changed, the switching elements 14A,14B are unlikely to be affected by the recovery current flowing through the recirculation elements 15A,15B in the same manner as the case of the first embodiment so that the emitter potential can be controlled from fluctuating.

In addition, the same operational effect as in the first embodiment is brought about.

Fifth Embodiment

Figure 14:
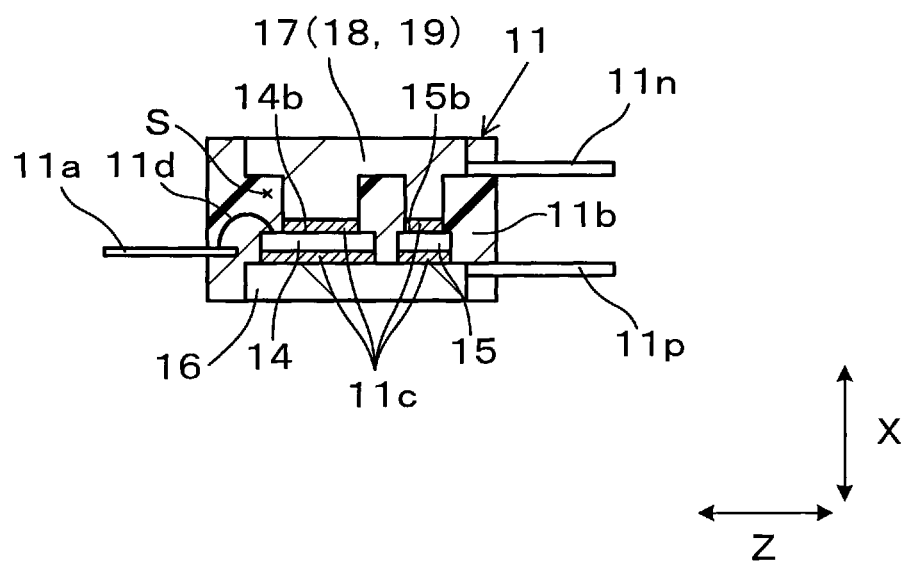
FIG. 14 is a sectional view of a plane defined by the first direction and the third direction of the semiconductor device of a fifth embodiment.

As shown in FIG. 14, the semiconductor device 11 of the fifth embodiment is different from the semiconductor device 11 of the first embodiment in the point that the spacers 18,19 are integrated with the heat sink 17.

In the fifth embodiment, the heat sink 17 is joined to the emitter electrode 14b via the solder layer 11c with respect to the switching element 14, and is joined to the anode electrode 15b via the solder layer 11c with respect to the recirculation element 15. In this case, the heat sink 17 also serves the function of the spacers 18,19.

The other configurations are the same as the first embodiment.

According to the fifth embodiment, the number of parts can be kept low by integrating the spacers 18,19 with the heat sink 17.

In addition, the same operational effect as in the first embodiment is brought about.

Sixth Embodiment

Figure 15:
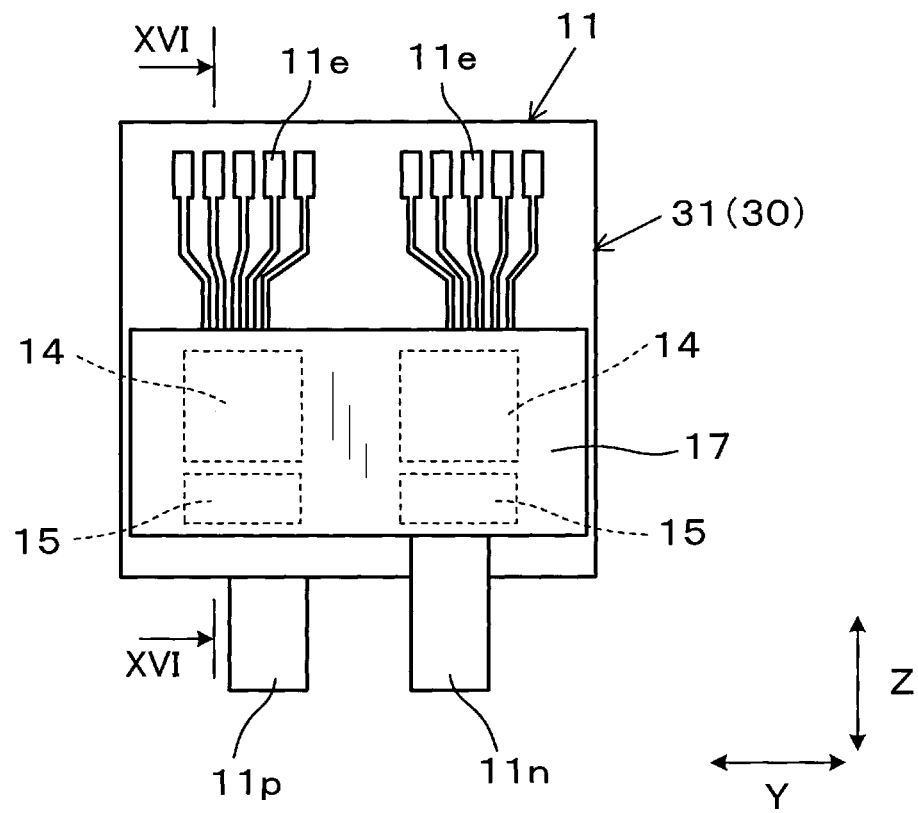
FIG. 15 is a side view of the semiconductor device of a sixth embodiment.
Figure 16:
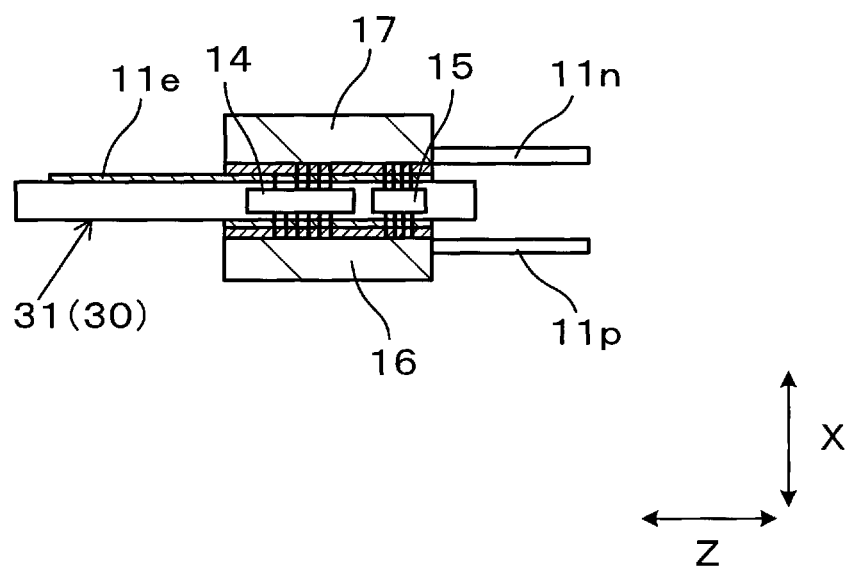
FIG. 16 is a sectional view taken along arrows XVI-XVI of FIG. 15.

As shown in FIGS. 15 and 16, the semiconductor device 11 of the sixth embodiment is different from the semiconductor device 11 of the first embodiment in the point that the control circuit board 31 of the control part 30 is interposed between the two heat sinks 16,17.

In the sixth embodiment, the control circuit board 31 is constituted as a multilayer printed circuit board. The control circuit board 31 has the same function as the spacers 18,19. Further, the control circuit board 31 is provided with a pattern wiring 11e as control lines interposed between the two switching elements 14,14 and the heat sink 17. Moreover, the pattern wiring 11e is used to constitute a connection line such as the wire 11d of the first embodiment. Therefore, the switching element 14 is electrically connected to the control part 30 via the pattern wiring 11e.

The other configurations are the same as the first embodiment.

According to the sixth embodiment, the pattern wiring 11e of the control circuit board 31 is used to connect the gate electrode 14c of the switching elements 14 to the control part 30. In addition, the same operational effect as in the first embodiment is brought about.

Note that, the abovementioned first to sixth embodiments describe the case when the number of switching elements 14 is two and the number of recirculation elements 15 is two, but the number of switching elements 14 and recirculation elements 15 may be a plurality, and it is also possible to utilize a separate embodiment in which the respective number of elements is set to three or more. In this case, with regards to the switching elements and the recirculation elements connected in parallel, if the condition that the distance from the emitter terminal to the recirculation element becomes no greater than the distance from the emitter terminal to the switching elements is satisfied, the respective arrangement patterns of the switching elements and the recirculation elements can be appropriately changed in accordance with need.

Separate embodiments are described below as the seventh to tenth embodiments.

Seventh Embodiment

Figure 17:
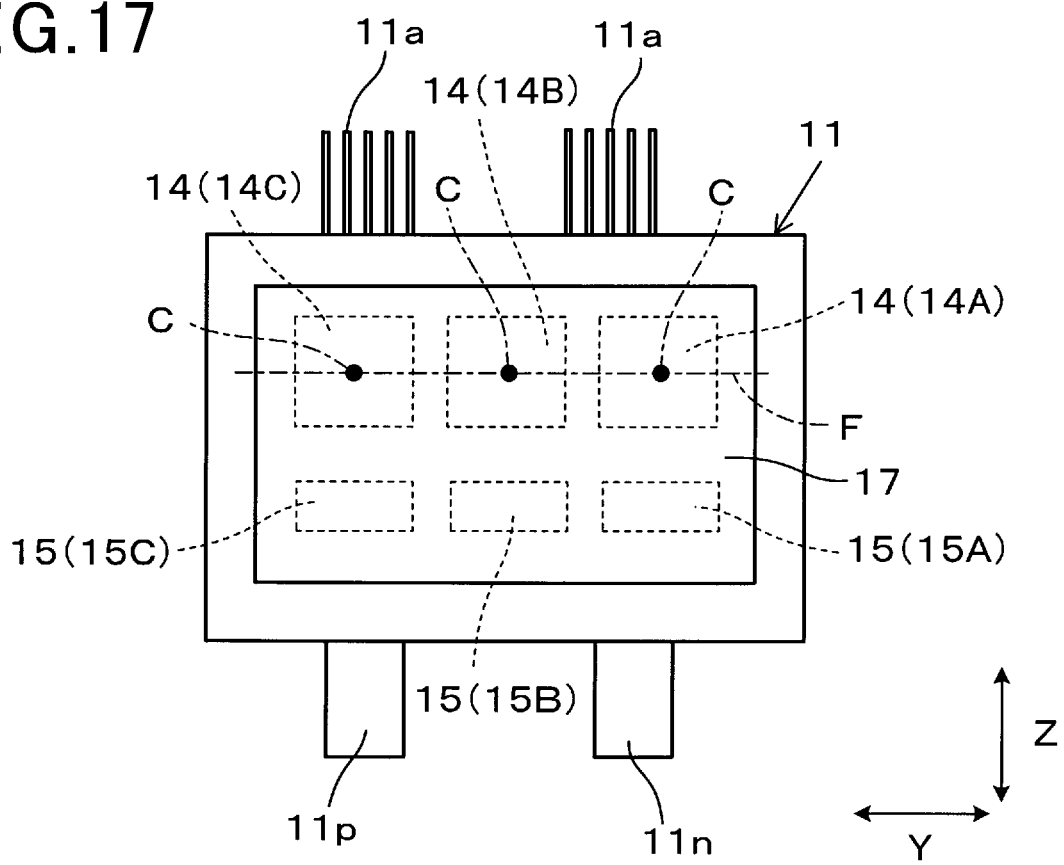
FIG. 17 is a side view of the semiconductor device of a seventh embodiment.

As shown in FIG. 17, the semiconductor device 11 of the seventh embodiment is different from the semiconductor device 11 of the first embodiment in the point that the number of switching elements 14 is three and the number of recirculation elements 15 is three.

In the seventh embodiment, the recirculation element 15A is connected in parallel to the switching elements 14A, the recirculation element 15B is connected in parallel to the switching element 14B, and the recirculation element 15C is connected in parallel to the switching elements 14C. Further, all of the three switching elements 14A,14B,14C are arranged adjacently and side by side parallel to each other, and the respective element centers C are arranged so as to be positioned on the same virtual straight line F extending in the second direction Y.

The other configurations are the same as the first embodiment.

According to the arrangement pattern of the seventh embodiment, the recirculation elements 15A,15B,15C are not interposed between the three switching elements 14A, 14B,14C, and the three switching elements 14A,14B,14C are arranged on the same virtual straight line F, thus, the distance of the emitter line can be kept short and the inductance can be kept low. In addition, the same operational effects as in the first embodiment are brought about.

Note that, as a modification of the arrangement pattern of the seventh embodiment, it is possible to use an arrangement pattern in which only two of the switching elements among the three switching elements 14A,14B,14C are adjacent to each other, and the recirculation elements are interposed between separate switching elements. In this case, the distance of the emitter line can be shortened with regards to the two adjacent switching elements.

Namely, if at least two among the plurality of switching elements are adjacent to each other, all of the plurality of switching elements may be adjacent, or only a part of the two switching elements may be adjacent to each other.

Eighth Embodiment

Figure 18:
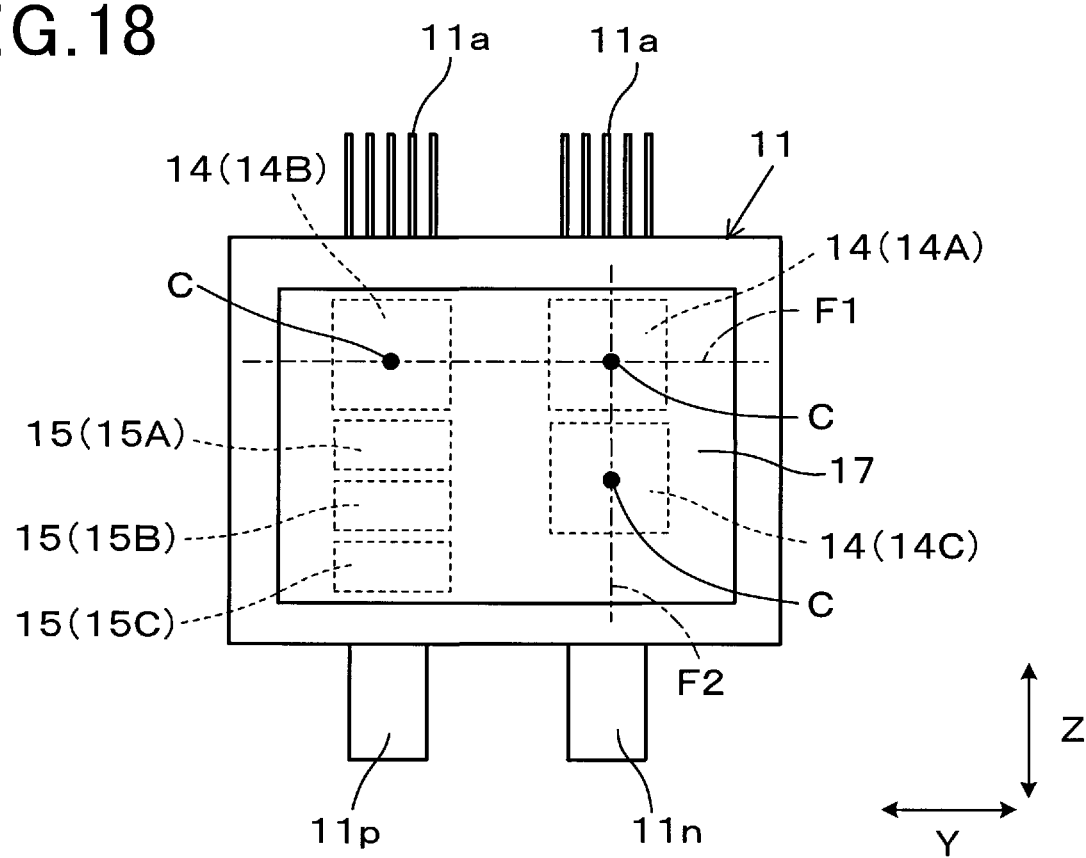
FIG. 18 is a side view of the semiconductor device of an eighth embodiment.

As shown in FIG. 18, the semiconductor device 11 of the eighth embodiment is different from the semiconductor device 11 of the seventh embodiment in the point that the three switching elements 14A,14B,14C are not on the one virtual straight line.

In the eighth embodiment, two adjacent switching elements 14A,14B are arranged adjacently and side by side parallel to each other, and the respective element centers C are arranged so as to be positioned on the same virtual straight line F1 extending in the second direction Y. Further, the two switching elements 14A,14C are arranged adjacently and longitudinally parallel to each other, and the respective element centers C are arranged so as to be positioned on the same virtual straight line F2 extending in the third direction Z. In this case, the virtual straight line F2 is orthogonal to the virtual straight line F1. The other configurations are the same as the seventh embodiment.

According to the arrangement pattern of the eighth embodiment, the recirculation elements 15A,15B,15C are not interposed between the three switching elements 14A, 14B,14C, and the two switching elements 14A,14B are arranged on the same virtual straight line F1, and the two switching elements 14A,14C are arranged on the same virtual straight line F2, thus the length of the emitter line can be kept short and the inductance can be kept low. In addition, the same operational effects as the seventh embodiment are brought about.

Ninth Embodiment

Figure 19:
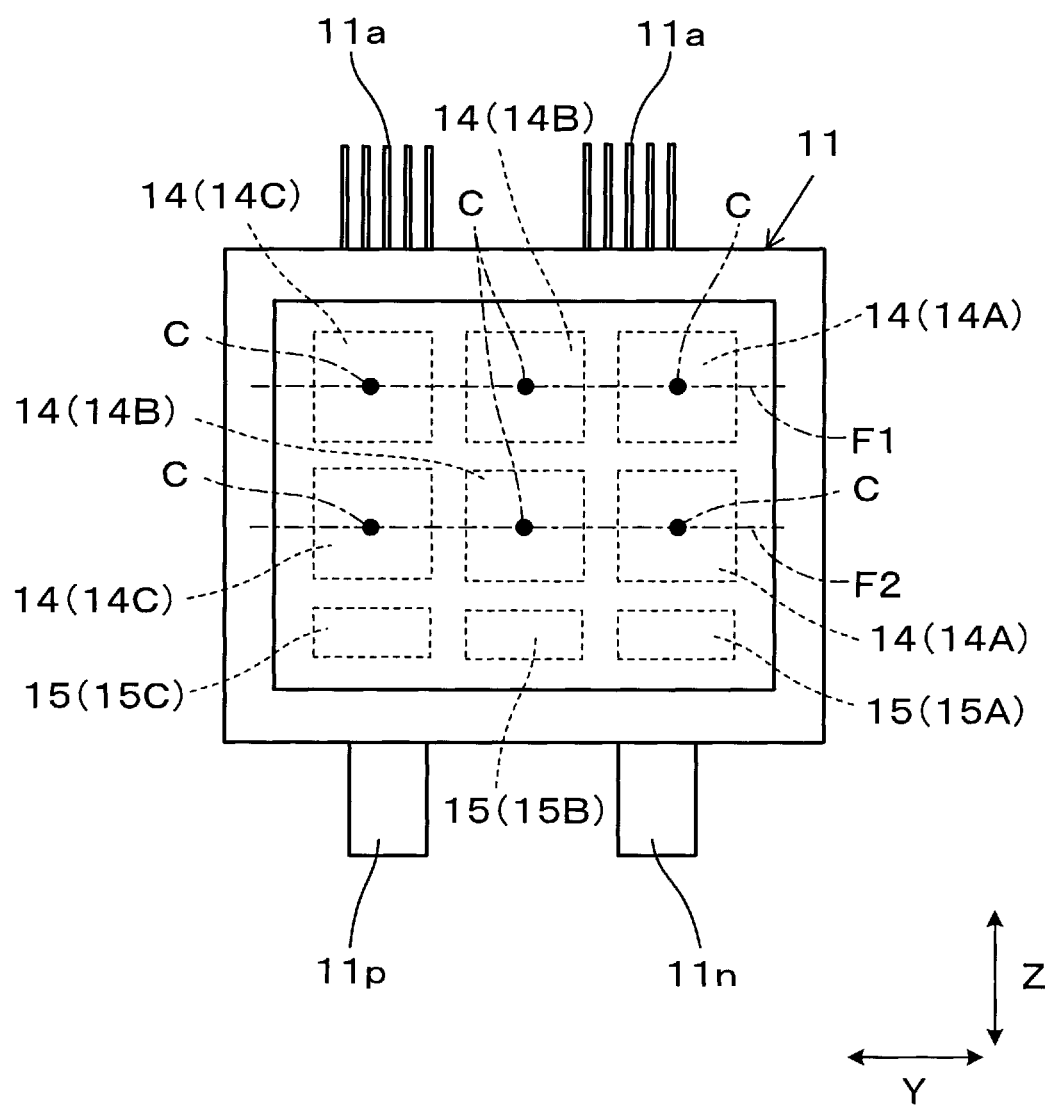
FIG. 19 is a side view of the semiconductor device of a ninth embodiment.

As shown in FIG. 19, the semiconductor device 11 of the ninth embodiment is different from the semiconductor device 11 of the first embodiment in the point that the number of switching elements 14 is six, and the number of recirculation elements 15 is three.

In the ninth embodiment, the recirculation element 15A is connected in parallel to the two switching elements 14A, 14A which were connected in parallel, the recirculation element 15B is connected in parallel to the two switching elements 14B,14B connected in parallel, and the recirculation element 15C is connected in parallel to the two switching elements 14C,14C which are connected in parallel.

Further, all of the three upper side switching elements 14A,14B,14C are arranged adjacently and side by side parallel to each other, and the respective element centers C are arranged so as to be positioned on the same virtual straight line F1 extending in the second direction Y. Similarly, all of the three lower side switching elements 14A, 14B,14C are arranged adjacently and side by side parallel to each other, and the respective element centers C are arranged so as to be positioned on the same virtual straight line F2 extending in the second direction Y. In this case, the virtual straight line F2 is parallel to the virtual straight line F1.

The other configurations are the same as the first embodiment.

According to the arrangement pattern of the ninth embodiment, the recirculation elements 15A,15B,15C are not interposed between the three switching elements 14A, 14B,14C, and the three switching elements 14A,14B,14C are arranged on the same virtual straight line F1 or on the virtual straight line F2, thus, the length of the emitter line can be kept short and the inductance can be kept low. In addition, the same operational effect as in the first embodiment is brought about.

Tenth Embodiment

Figure 20:
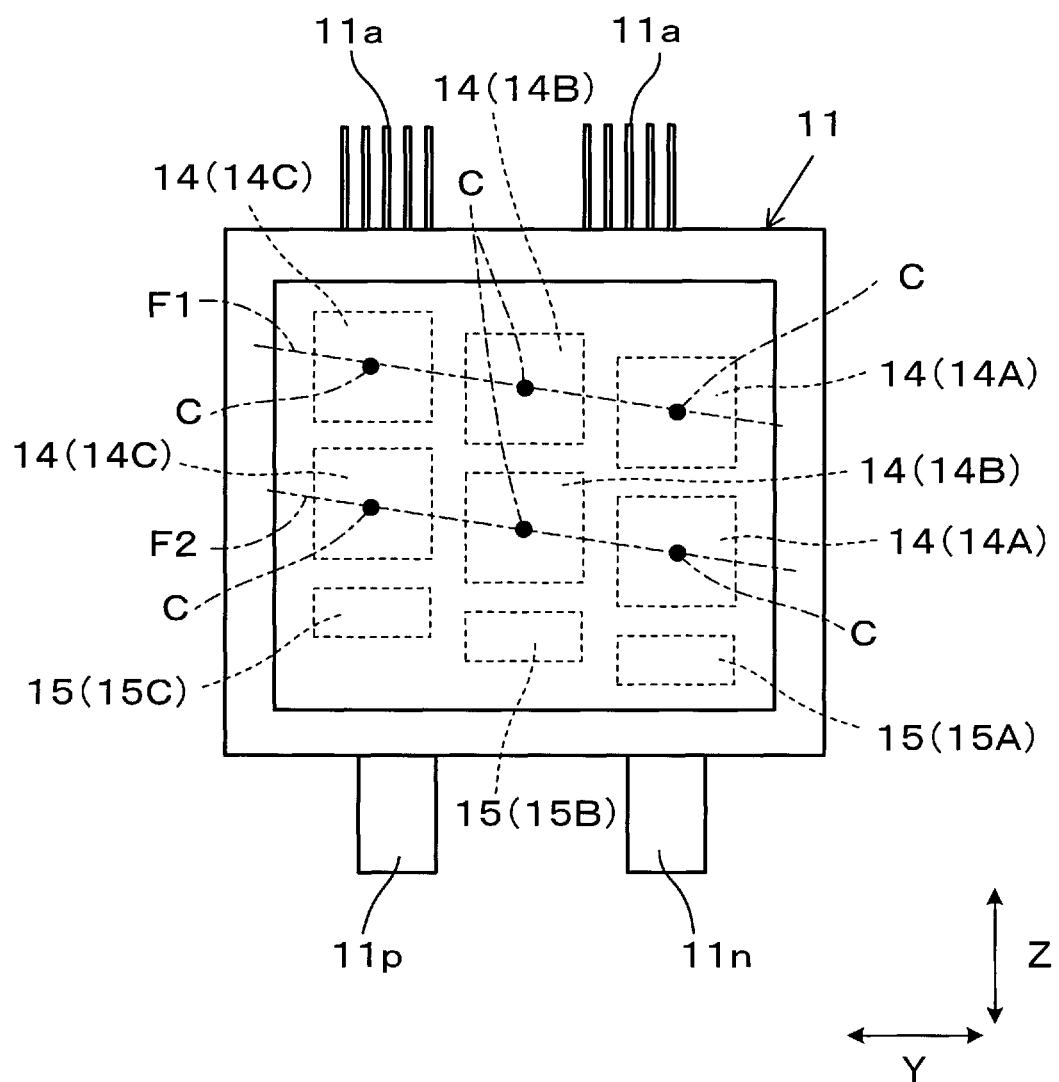
FIG. 20 is a side view of the semiconductor device of a tenth embodiment.

As shown in FIG. 20, the semiconductor device 11 of the tenth embodiment is different from the semiconductor device 11 of the ninth embodiment in the point that both the virtual straight line F1 and the virtual straight line F2 which are parallel to each other extend across the second direction Y.

In the tenth embodiment, the three upper side switching elements 14A,14B,14C are arranged to be adjacent to each other and in an oblique direction intersecting with the second direction Y, and the respective element centers C are arranged so as to be positioned on the virtual straight line F1. Similarly, the three lower side switching elements 14A,14B, 14C are arranged to be adjacent to each other and in an oblique direction intersecting with the second direction Y, and the respective element centers C are arranged so as to be positioned on the virtual straight line F2. The other configurations are the same as the ninth embodiment.

According to the arrangement pattern of the tenth embodiment, while the length of the emitter line is longer compared to the ninth embodiment, the effect by which the length of the emitter line is kept short can be obtained.

Eleventh Embodiment

Figure 21:
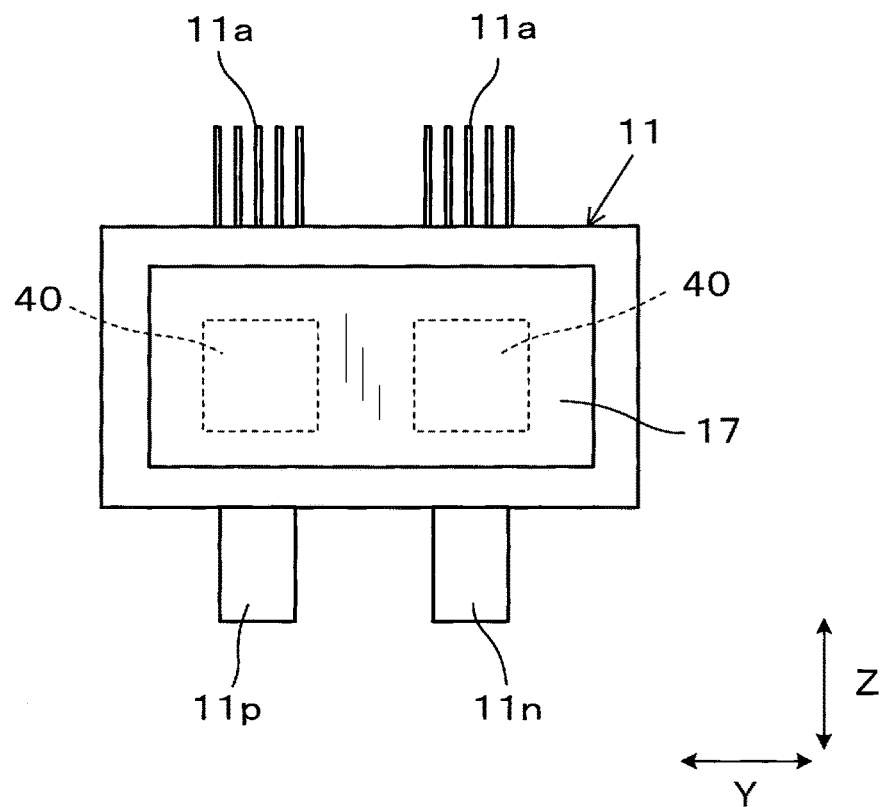
FIG. 21 is a side view of the semiconductor device of an eleventh embodiment.

As shown in FIG. 21, the semiconductor device 11 of the eleventh embodiment is different from the semiconductor device 11 of the first embodiment in the point that the switching element 14 and the recirculation element 15 which are connected in parallel were replaced by a composite element 40.

In the eleventh embodiment, the semiconductor device 11 is provided with two composite elements 40. The other configurations are the same as the first embodiment.

The composite element 40 is provided with both a region used as the switching element 14, and a region used as the recirculation element 15. Namely, the composite element 40 is constituted as one composite element having the respective functions of the switching element 14 and the recirculation element 15 which are connected in parallel.

Typically, a Reverse-Conducting Insulated Gate Bipolar Transistor (RC-IGBT) in which an IGBT as the switching element and an FWD as the recirculation element are integrated into a single chip, and a SiC-Metal-Oxide-Semiconductor Field-Effect Transistor (SiC-MOSFET) in which a diode is incorporated as the recirculation element can be used as the composite element 40.

Note that, for the detailed configuration of RC-IGBT, refer to the configuration of the RC-IGBT disclosed in, for example, JP-A 2009-099690.

According to the eleventh embodiment, the configuration of the semiconductor device 11 can be simplified and miniaturized by using the composite element 40. In addition, the same operational effect as in the first embodiment is brought about.

Twelfth Embodiment

Figure 22:
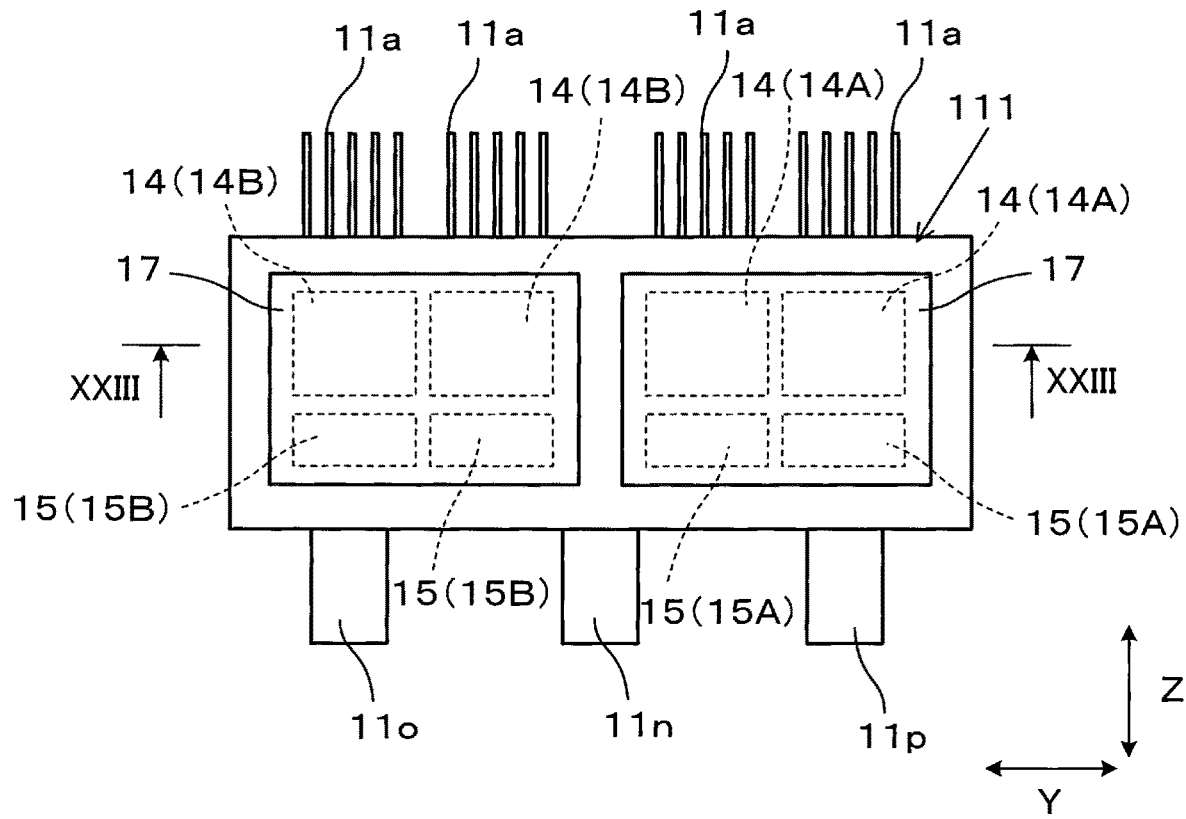
FIG. 22 is a side view of the semiconductor device of a twelfth embodiment.

As shown in FIG. 22, the semiconductor device 111 of the twelfth embodiment is different from the semiconductor device 11 of the first embodiment in the point that two semiconductor element pairs consisting of two switching elements are provided.

In the twelfth embodiment, the two semiconductor element pairs of the semiconductor device 111 are connected in series between the high potential side line Lp and the low potential side line Ln of the power source B. The semiconductor device 111 is a semiconductor module having a configuration in which one upper arm semiconductor device 11H (hereinafter, referred to as the "upper arm 11H") and one lower arm semiconductor device 11L (simply referred to as the "lower arm 11L") in FIG. 9 were combined, and is referred to as a "2in1 module".

In the case of the 2in1 module, the parallel connection body of the lower arm has a low potential with respect to the parallel connection body of the upper arm, and corresponds to the condition of "with regards to the switching elements and the recirculation elements connected in parallel on the lowest potential side among the resin-sealed semiconductor modules, the distance from the emitter terminal connected to the emitter electrode to the recirculation element becomes no greater than the distance from the emitter terminal to the switching element".

In the semiconductor device 111, the emitter line Le is constituted by the heat sink 17 in the respective upper arm semiconductor device 11H and lower arm semiconductor device 11L in the same manner as the semiconductor device 11 of the first embodiment. Therefore, even in the case when the time change rate of the current is large, the emitter potential difference can be kept low when the recovery current flows in the emitter line Le.

Figure 24:
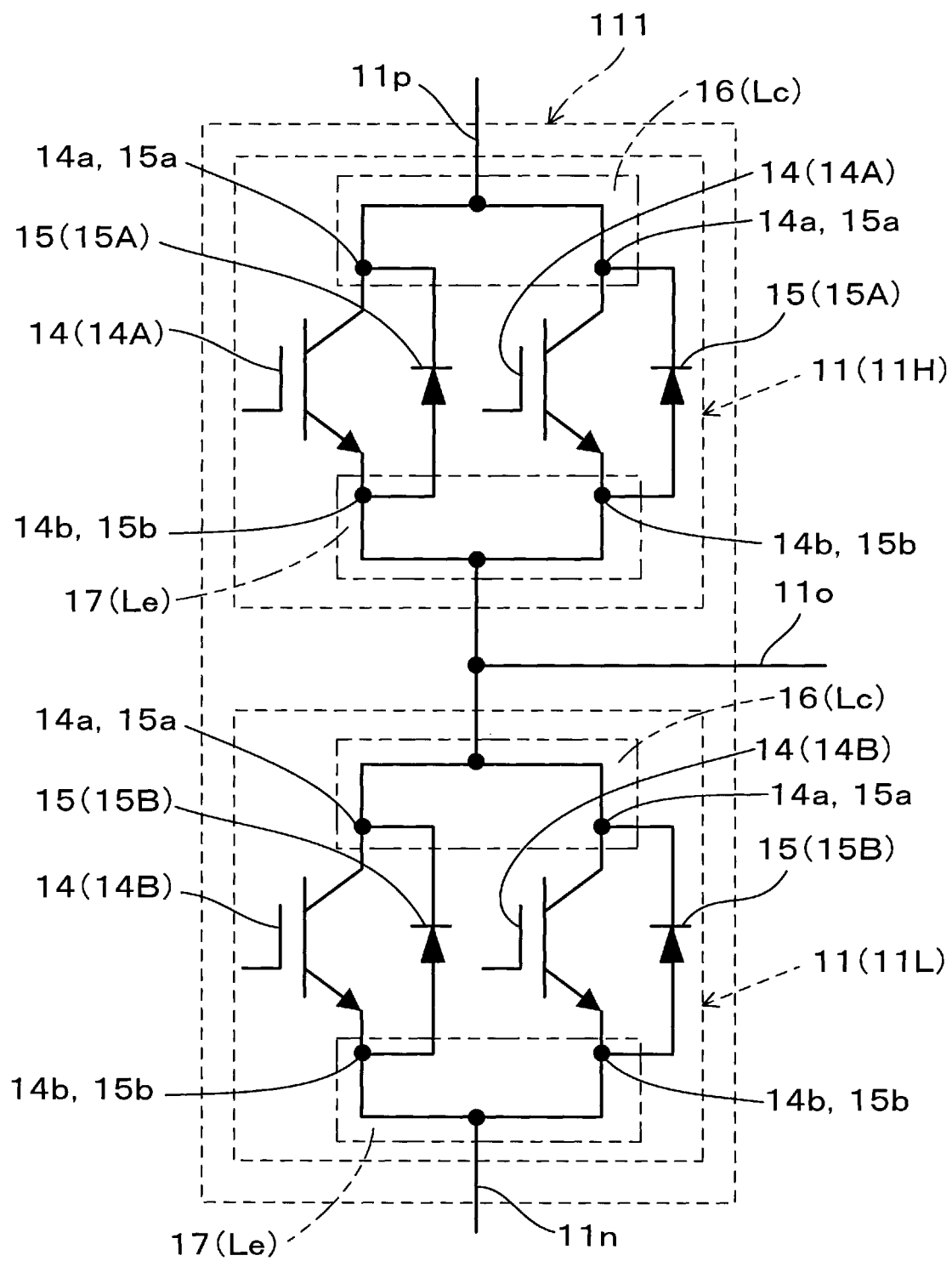
FIG. 24 is an equivalent circuit diagram of the semiconductor device of the twelfth embodiment.

With reference to FIGS. 22 and 24, the semiconductor device 111 is provided with the collector terminal 11p, the emitter terminal 11n and the output terminal 11o as a power terminal. A DC voltage is applied to the semiconductor device 111 via the collector terminal 11p and the emitter terminal 11n, and AC power is output from the semiconductor device 111 through the output terminal 11o.

The upper arm semiconductor device 11H is a high potential side arm, and is provided with two switching elements 14A,14A connected in parallel to each other and two recirculation elements 15A,15A. One recirculation element 15A is inversely connected in parallel (hereinafter, simply referred to as the "connected in parallel to") to one switching element 14A. Namely, the upper arm semiconductor device 11H is provided with two sets of the switching element 14A and the recirculation element 15A connected in parallel to each other.

Note that, there may be three or more sets of the switching element 14A and the recirculation element 15A connected in parallel to each other in the upper arm semiconductor device 11H.

The lower arm semiconductor device 11L is a low potential side arm, and is provided with two switching element 14B,14B connected in parallel to each other and two recirculation elements 15B,15B. One recirculation element 15B is inversely connected in parallel to one switching element 14B. Namely, the lower arm semiconductor device 11L is provided with two sets of the switching element 14B and the recirculation element 15B connected in parallel to each other. Note that, there may be three or more sets of the switching element 14B and the recirculation element 15B connected in parallel to each other in the lower arm semiconductor device 11L.

Four switching elements 14,14 and four recirculation elements 15,15 are arranged in a plane in a virtual plane (the virtual plane including the direction in which the collector terminal 11p extends, and the direction in which the output terminal 11o extends) including the direction in which the emitter terminal 11n extends.

Figure 23:
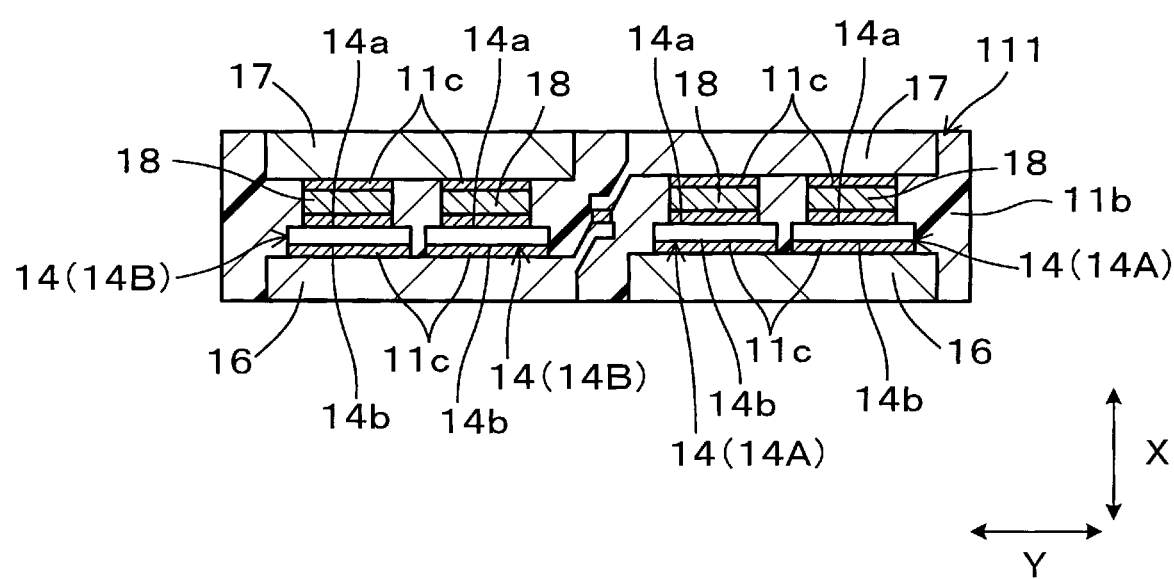
FIG. 23 is a sectional view taken along arrows XXIII-XXIII of FIG. 22.

As shown in FIG. 23, the semiconductor device 111 is molded by the mold resin 11b in the same manner as the semiconductor device 11. Therefore, the two sets of the switching element 14A and the recirculation element 15A connected in parallel to each other in the upper arm semiconductor device 11H and the two sets of the switching element 14B and the recirculation element 15B connected in parallel to each other in the lower arm semiconductor device 11L constitute one semiconductor module sealed with resin. Namely, each of the four switching elements 14 and the recirculation elements 15 constitute one semiconductor module sealed with resin. Further, the heat sink 17 of the upper arm semiconductor device 11H and the heat sink 16 of the lower arm semiconductor device 11L are electrically connected via the solder layer 11c.

In the semiconductor device 111, the output terminal 11o becomes the emitter terminal of the upper arm semiconductor device 11H, and the emitter terminal 11n becomes the emitter terminal of the lower arm semiconductor device 11L. Therefore, in the following explanation, in the case of the upper arm semiconductor device 11H, the output terminal 11o also refers to the emitter terminal 11o.

With reference to FIGS. 23 and 24, the emitter electrode 14b of the switching element 14A and the anode electrode 15b of the recirculation element 15A are electrically connected in the upper arm semiconductor device 11H by the heat sink 17 which is the same plate-like member. Similarly, in the lower arm semiconductor device 11L, the emitter electrode 14b of the switching element 14B and the anode electrode 15b of the recirculation element 15B are electrically connected by the heat sink 17 which is the same plate-like member.

The emitter terminal 11o of the upper arm semiconductor device 11H does not correspond to the condition of the lowest potential side, and can be arranged anywhere.

On the one hand, the lower arm semiconductor device 11L corresponds to the condition that the lowest potential side among the semiconductor modules is sealed with resin and both of the two sets of the switching element 14B and the recirculation element 15B connected in parallel to each other which pertains to the lower arm semiconductor device 11 are constituted so that the distance from the emitter terminal 11n to the recirculation element 15B is lower than the distance from the emitter terminal 11n to the switching element 14B. Namely, the recirculation element 15B is closer to the emitter terminal 11n than the switching element 14B.

The operational effect of the semiconductor device 111 of the twelfth embodiment will be explained with reference to the pattern diagrams of FIGS. 25 to 28.

Note that, in these drawings, for convenience of explanation, one each of the switching element and the recirculation element are indicated in the respective upper arm semiconductor device 11H and the lower arm semiconductor device 11L. Further, in these drawings, the path Pa where the output current flows to the switching elements is indicated by a broken line with an arrow, and the path Pb where the recovery current flows to the recirculation element during the recovery period is indicated by a solid line with an arrow.

Figure 25:
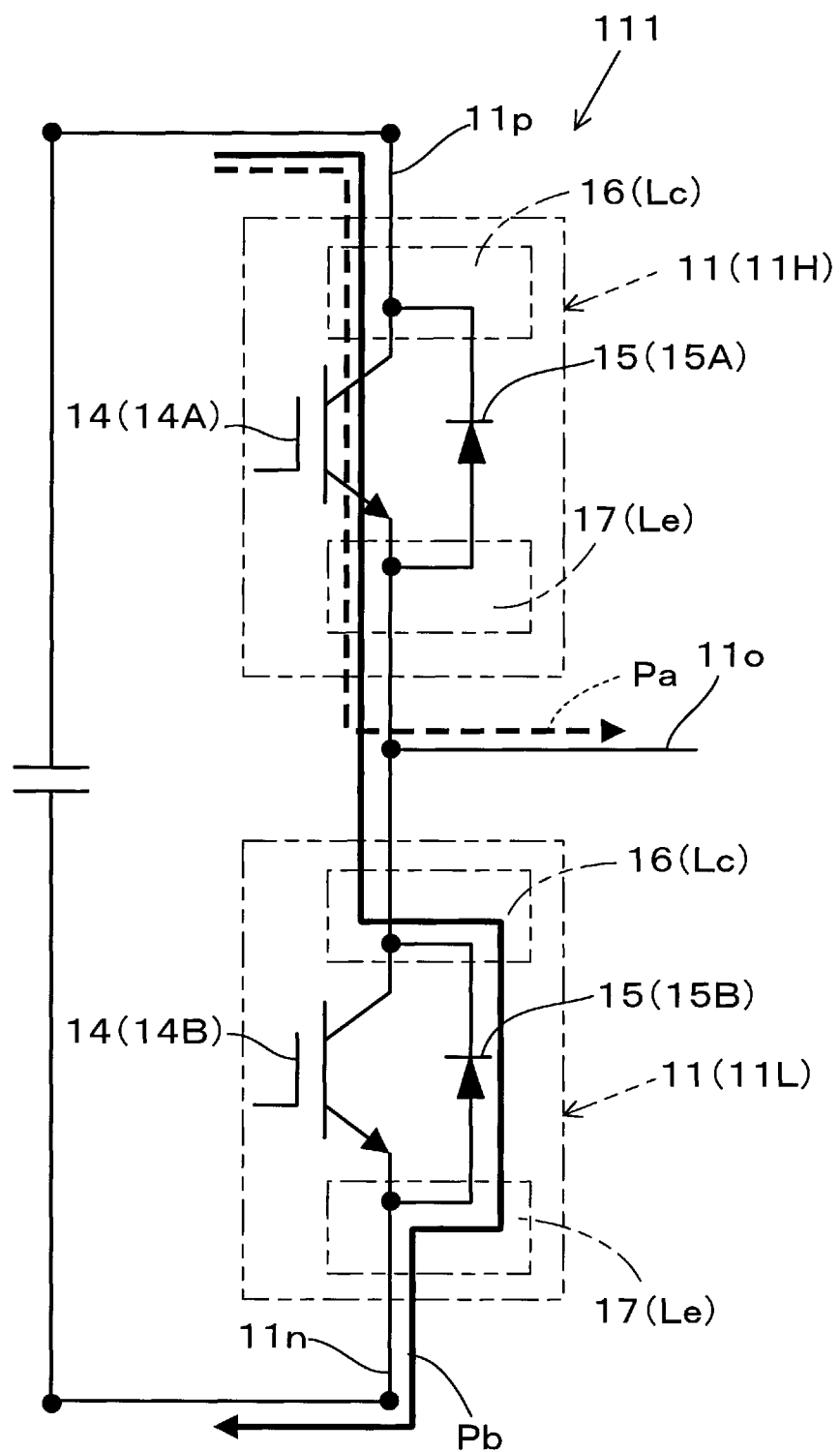
FIG. 25 is a circuit diagram schematically illustrating a part of the circuit of the semiconductor device of the twelfth embodiment.

As shown in FIG. 25, when the switching element 14A of the upper arm semiconductor device 11H is the switching side, the recovery current flows to the recirculation element 15B of the lower arm semiconductor device 11L. The path Pb of the recovery current is the path which passes from the collector terminal 11p through the switching element 14A and the recirculation element 15B sequentially and passes toward the emitter terminal 11n.

Figure 26:
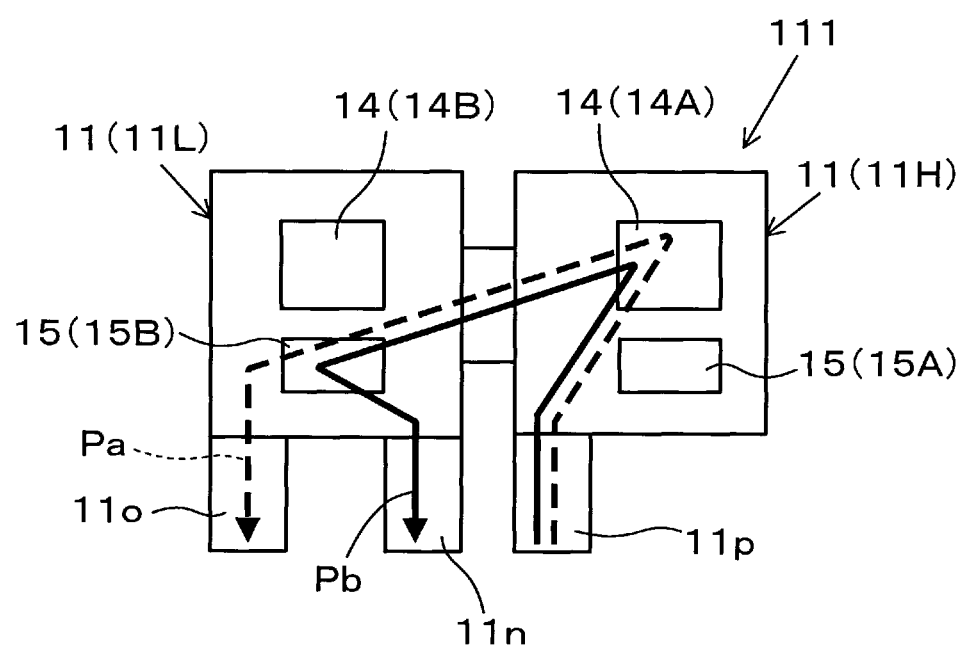
FIG. 26 is a side view schematically illustrating an element of a part of the semiconductor device of the twelfth embodiment.

As shown in FIG. 26, the recirculation element 15B is closer to the emitter terminal 11n compared to the switching element 14B. Therefore, the switching element 14B of the lower arm semiconductor device 11L, i.e., the switching element 14B which is the non-switching side and is in a position separated from the path Pb without being on the path Pb of the recovery current. Therefore, the recovery current flowing through the recirculation element 15B makes it difficult for the emitter potential of the switching element 14B to fluctuate.

Figure 27:
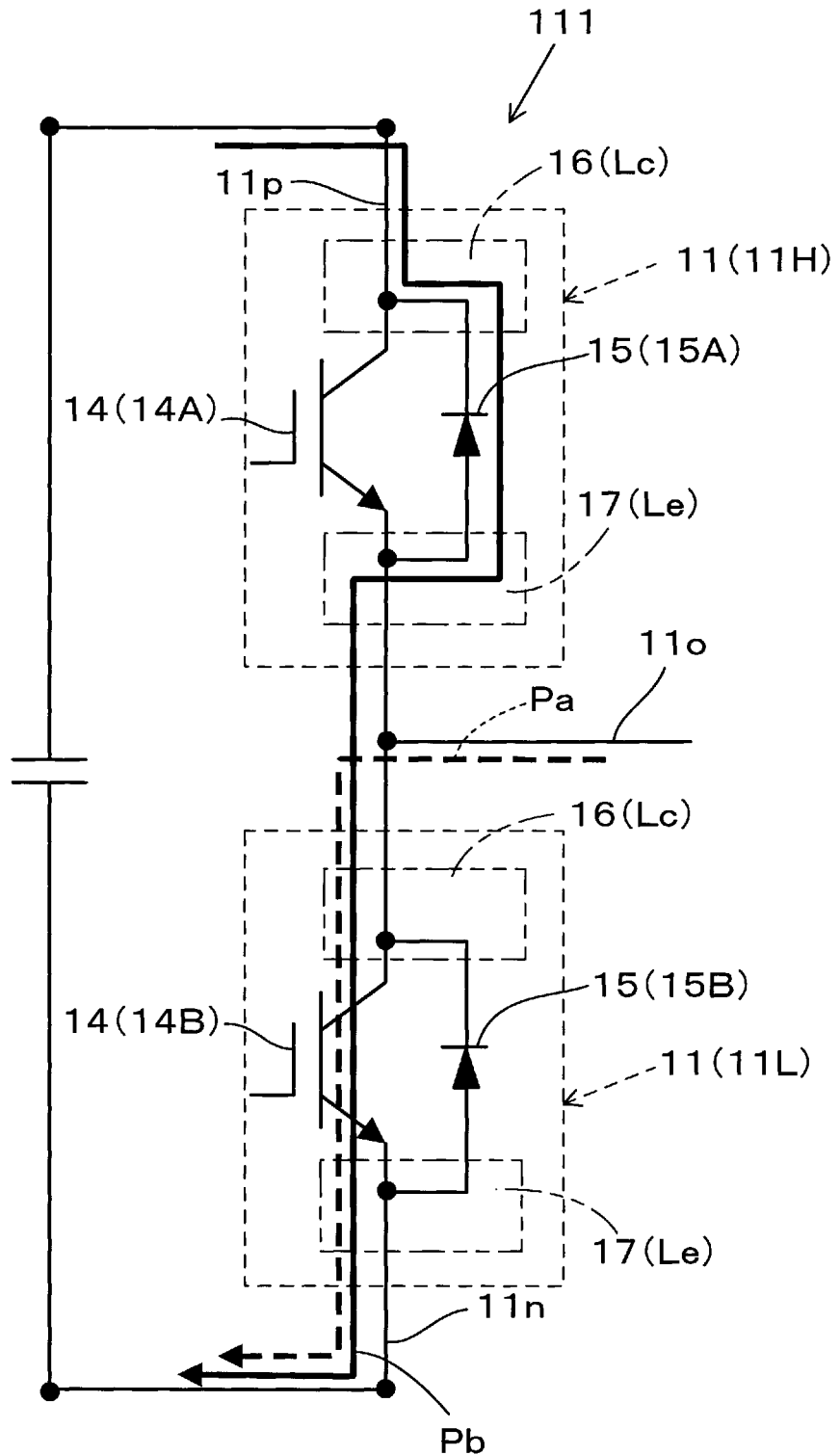
FIG. 27 is a circuit diagram schematically illustrating a part of the circuit of the semiconductor device of the twelfth embodiment.

On the one hand, as shown in FIG. 27, when the switching element 14B of the lower arm semiconductor device 11L is the switching side, the recovery current flows to the recirculation element 15A of the upper arm semiconductor device 11H. The path Pb of the recovery current is the path which passes from the collector terminal 11p through the recirculation element 15A and the switching element 14B sequentially and passes toward the emitter terminal 11n.

Figure 28:
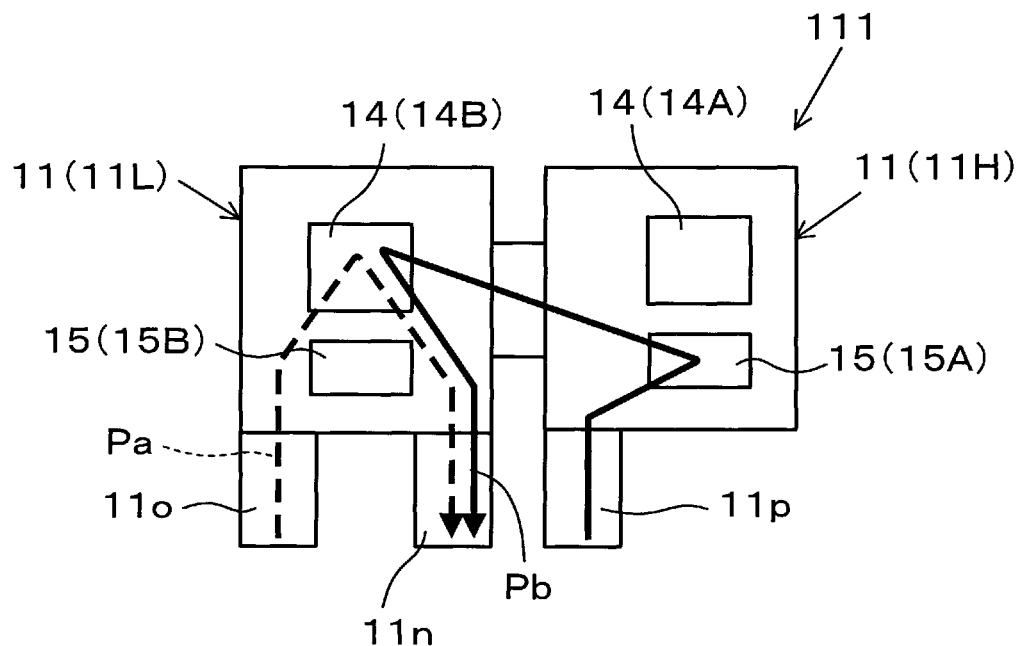
FIG. 28 is a side view schematically illustrating an element of a part of the semiconductor device of the twelfth embodiment.

As shown in FIG. 28, the recirculation element 15A is closer to emitter terminal 11n compared to the switching element 14A. Therefore, the switching element 14A of the upper arm semiconductor device 11H, i.e., the switching element 14A which is the non-switching side is in a position separated from the path Pb without being on the path Pb of the recovery current. Therefore, the recovery current flowing through the recirculation element 15A makes it difficult for the emitter potential of the switching element 14A to fluctuate.

In addition, the same operational effect as in the first embodiment is brought about.

In the aforementioned twelfth embodiment, the emitter terminal 11o is on the recirculation element 15B side of the lower arm semiconductor device 11L and is arranged on the side opposite to the collector terminal 11p sandwiching the emitter terminal 11n (refer to, for example, FIG. 26), but the arrangement of the emitter terminal 11o can be appropriately changed.

Three modifications are described below regarding the arrangement of the emitter terminal 11o. Note that, in the drawings which describe these modifications, the same components as those in FIG. 29 are denoted by the same reference numerals.

Figure 29:
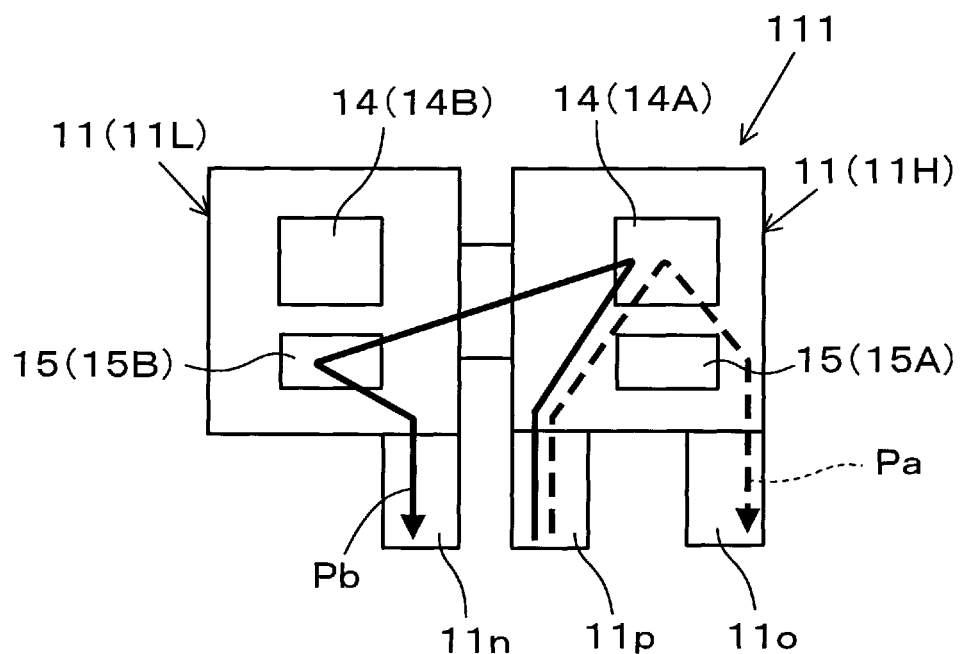
FIG. 29 is a side view schematically illustrating an element of a part of the semiconductor device according to a first modification of the twelfth embodiment.

The first modification shown in FIG. 29 is an example in which the emitter terminal 11o is on the recirculation element 15A of the upper arm semiconductor device 11H side and is arranged on the side opposite to the emitter terminal 11n sandwiching the collector terminal 11p.

In the first modification, when the switching element 14A of the upper arm semiconductor device 11H is the switching side, the switching element 14B which is the non-switching side is in a position separated from the path Pb without being on the path Pb of the recovery current. Therefore, the recovery current flowing through the recirculation element 15B makes it difficult for the emitter potential of the switching element 14B to fluctuate.

Figure 30:
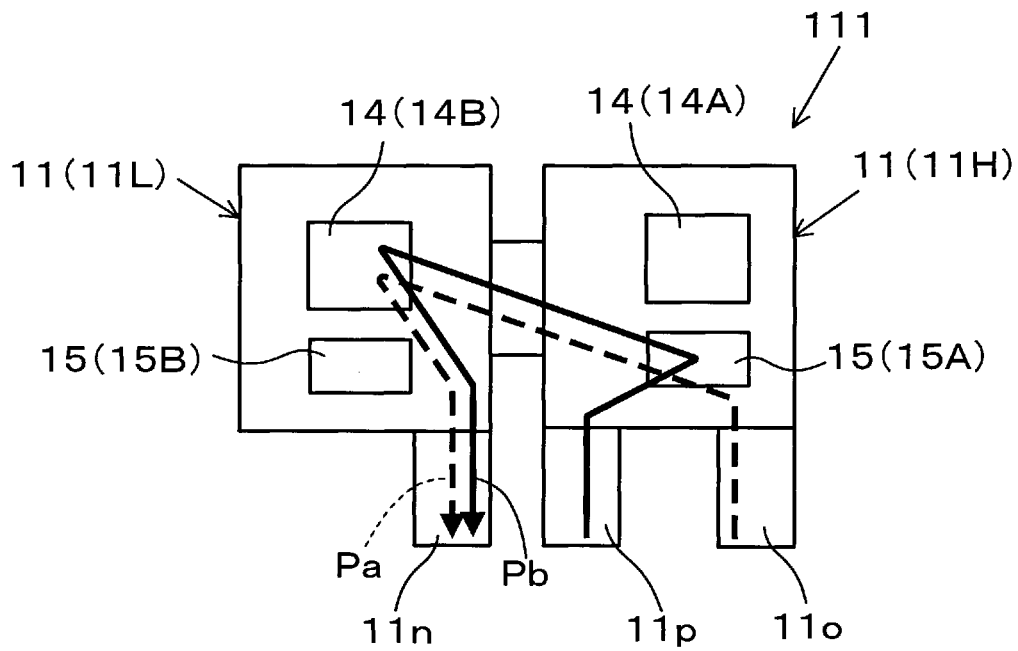
FIG. 30 is a side view schematically illustrating an element of a part of the semiconductor device according to the first modification of the twelfth embodiment.

On the one hand, in the first modification, when the switching element 14B of the lower arm semiconductor device 11L is the switching side, as shown in FIG. 30, the switching element 14A which is the non-switching side is in a position separated from the path Pb without being on the path of the recovery current. Therefore, the recovery current flowing through the recirculation element 15A makes it difficult for the emitter potential of the switching element 14A to fluctuate.

Figure 31:
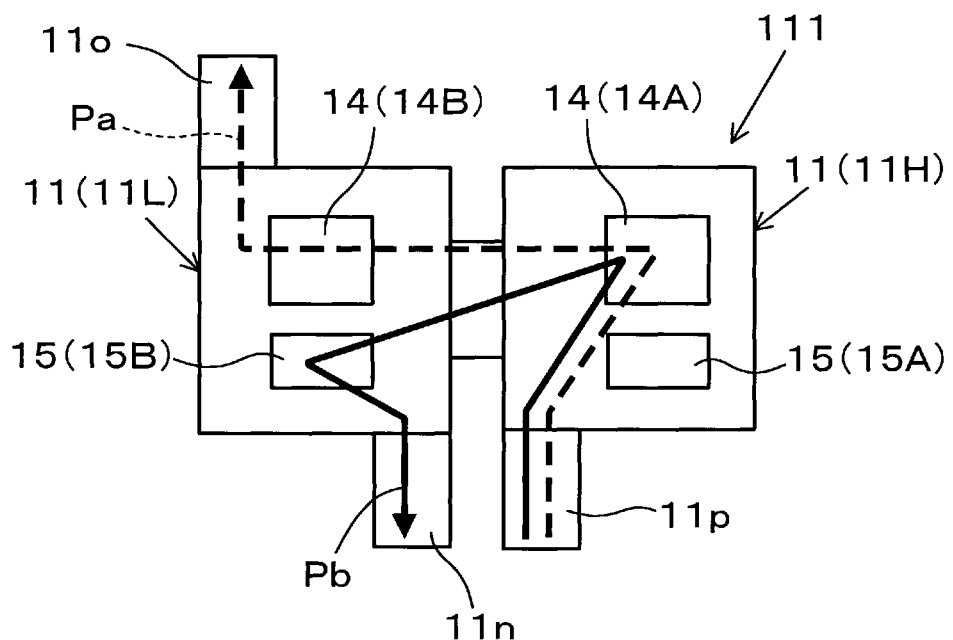
FIG. 31 is a side view schematically illustrating an element of a part of the semiconductor device according to a second modification of the twelfth embodiment.

The second modification shown in FIG. 31 is an example in which the emitter terminal 11o is arranged in the switching element 14B of the lower arm semiconductor device 11L side.

In the second modification, when the switching element 14A of the upper arm semiconductor device 11H is the switching side, while the switching element 14B which is the non-switching side is on the path Pa of the output current, the switching element 14A is in a position separated from the path Pb without being on the path Pb of the recovery current. Therefore, the recovery current flowing through the recirculation element 15B makes it difficult for the emitter potential of the switching element 14B to fluctuate.

Figure 32:
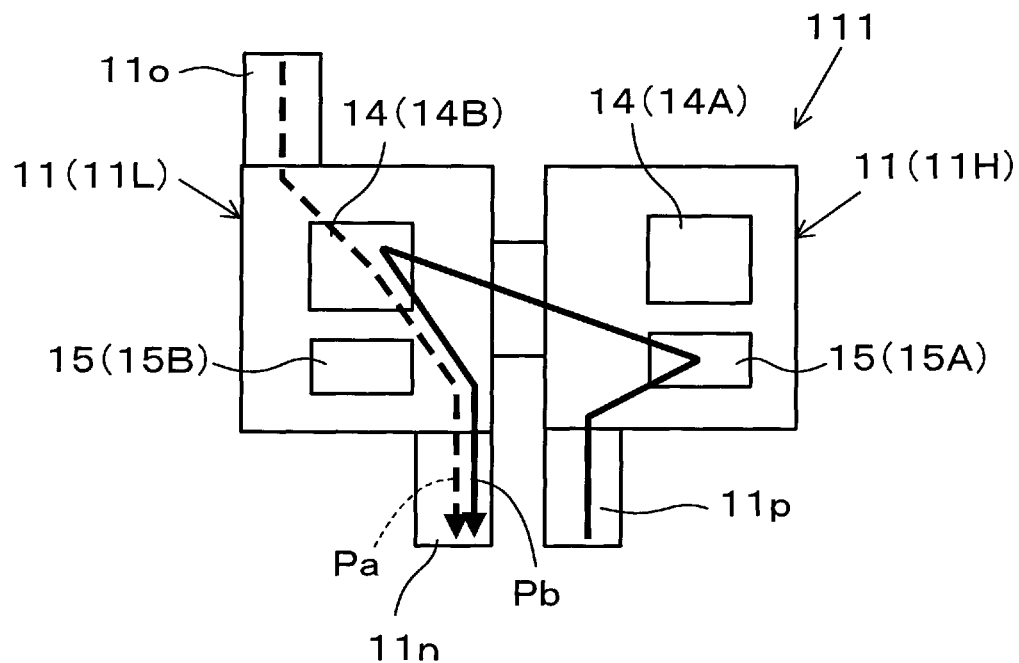
FIG. 32 is a side view schematically illustrating an element of a part of the semiconductor device according to the second modification of the twelfth embodiment.

On the one hand, in the second modification, when the switching element 14B of the lower arm semiconductor device 11L is the switching side, as shown in FIG. 32, the switching element 14A which is the non-switching side is in a position separated from the path Pb without being on the path Pb of the recovery current. Therefore, the recovery current flowing through the recirculation element 15A makes it difficult for the emitter potential of the switching element 14A to fluctuate.

Figure 33:
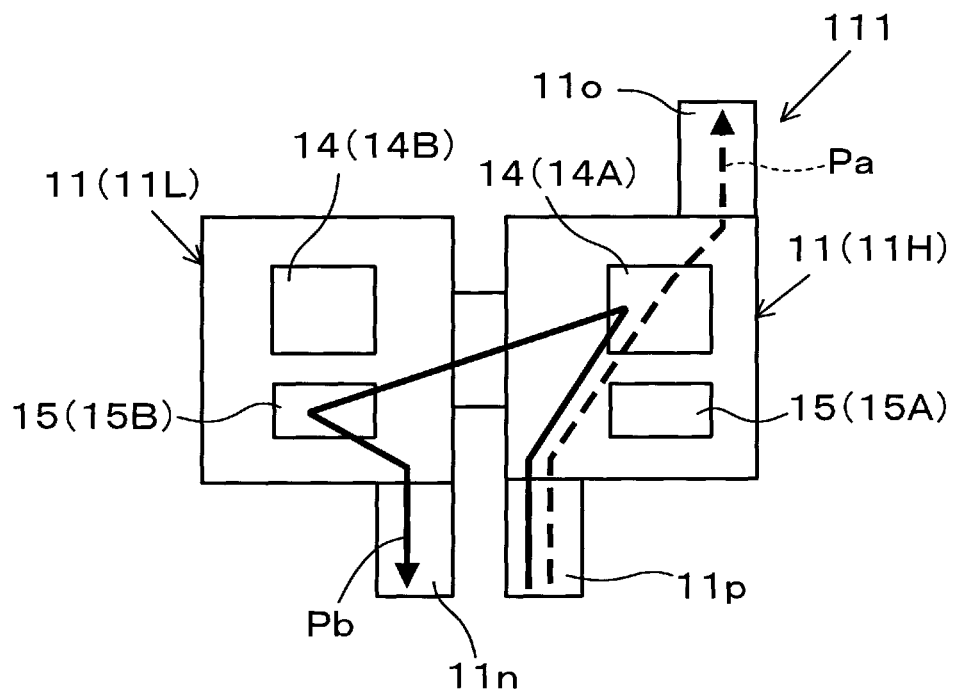
FIG. 33 is a side view schematically illustrating an element of a part of the semiconductor device according to a third modification of the twelfth embodiment.

The third modification shown in FIG. 33 is an example in which the emitter terminal 11o is arranged in the switching element 14A of the upper arm semiconductor device 11H side.

In the third modification, when the switching element 14A of the upper arm semiconductor device 11H is the switching side, the switching element 14B which is the non-switching side is in a position separated from the path Pb without being on the path Pb of the recovery current. Therefore, the recovery current flowing through the recirculation element 15B makes it difficult for the emitter potential of the switching element 14B to fluctuate.

Figure 34:
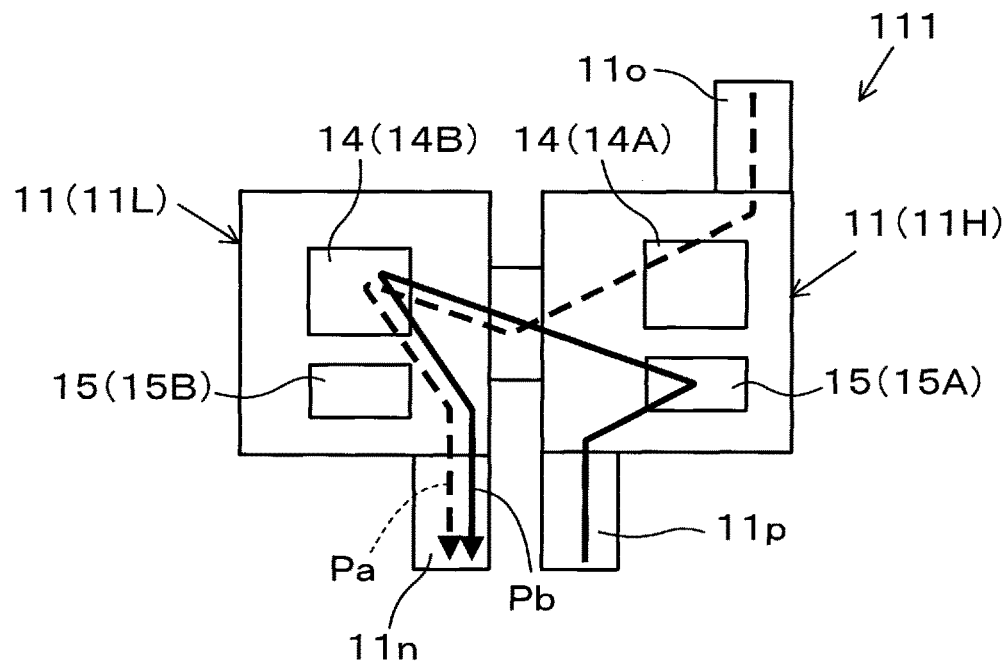
FIG. 34 is a side view schematically illustrating an element of a part of the semiconductor device according to the third modification of the twelfth embodiment.

On the one hand, in the third modification, when the switching element 14B of the lower arm semiconductor device 11L is the switching side, as shown in FIG. 34, while the switching element 14A which is the non-switching side is on the path Pa of the output current, the switching element 14B is in a position separated from the path Pb without being on the path Pb of the recovery current. Therefore, the recovery current flowing through the recirculation element 15A makes it difficult for the emitter potential of the switching element 14A to fluctuate.

In the cases of the aforementioned three modifications, the same operational effect as the twelfth embodiment is brought about.

Note that, examples other than these modifications can be used if at least the condition that the switching element which is the non-switching side is in a position separated from the path of the recovery current is satisfied.

Thirteenth Embodiment

Figure 35:
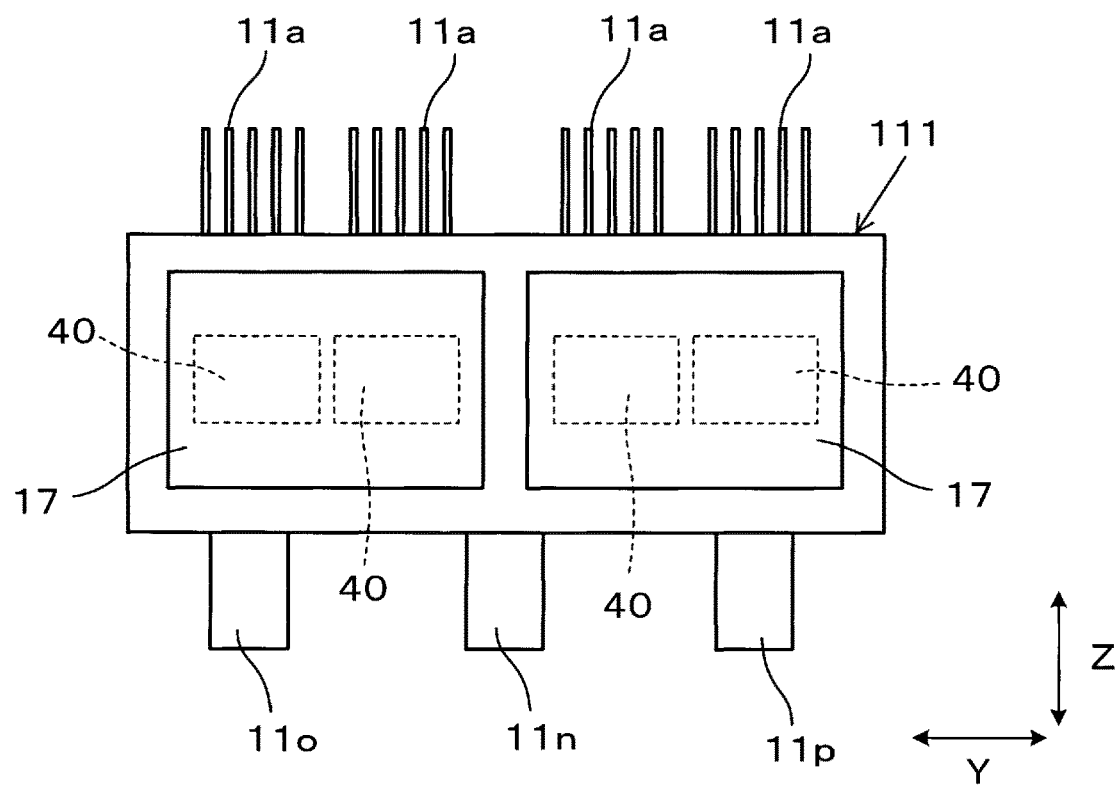
FIG. 35 is a side view of the semiconductor device of a thirteenth embodiment.

As shown in FIG. 35, the semiconductor device 111 of the thirteenth embodiment is different from the semiconductor device 111 of the twelfth embodiment in the point that the switching element 14A and the recirculation element 15A which are connected in parallel, and the switching element 14B and the recirculation element 15B which are connected in parallel can be replaced by the abovementioned composite element 40.

In the thirteenth embodiment, the semiconductor device 111 is provided with four composite elements 40.

The other configurations are the same as the twelfth embodiment.

According to the thirteenth embodiment, the configuration of the semiconductor device 111 can be simplified and miniaturized by using the composite element 40.

In addition, the same operational effect as the twelfth embodiment is brought about.

Fourteenth Embodiment

As shown in FIG. 36, the semiconductor device 211 of the fourteenth embodiment is the semiconductor module having a configuration in which all of the three upper arm semiconductor devices 11H and the three lower arm semiconductor devices 11L in FIG. 9 were combined, and is referred to as a "6in1 module".

The semiconductor device 211 corresponds to the three aspects of the semiconductor device 111 of the thirteenth embodiment, and is provided with twelve composite elements 40. Further, the semiconductor device 211 is provided with the collector terminal 11p, the emitter terminal 11n, the output terminal 11o (U), the output terminal 11o (V) and the output terminal 11o (W) as the power terminal. With reference to FIG. 9, the output terminal 11o (U) is the U phase output terminal. The output terminal 11o (V) is the V phase output terminal. The output terminal 11o (W) is the W phase output terminal.

The other configurations are the same as the thirteenth embodiment.

Note that, the switching element 14 and the recirculation element 15 which are connected in parallel can be used in place of each composite element 40.

The other configurations are the same as the thirteenth embodiment.

According to the fourteenth embodiment, it is difficult for the emitter potential of the composite element 40 to fluctuate in each of the U phase, the V phase and the W phase which are the three phases, and the propagation of the fluctuations of the emitter potential in one phase to another phase can be controlled. In addition, the same operational effect as in the thirteenth embodiment is brought about.

The present disclosure is not limited to only the above-described typical embodiment. The invention may be applied in various manners and various modifications may be made to the above-described embodiment without departing from the scope of the invention. For example, the invention may be implemented in each of embodiments described below in which modifications are made to the above-described embodiment.

Each of the aforementioned embodiments describes the case of one recirculation element connected in parallel to one switching element, but the number of recirculation elements connected in parallel to one switching element is not limited to one, and may be two or more in accordance with need.

Each of the aforementioned embodiments describes the case when using a heat sink as the plate-like member which electrically connects the emitter electrode of the switching element with the anode electrode of the recirculation element, but a plate-like member separate from a heat sink may be used as the plate-like member.

Each of the aforementioned embodiments describes the case when the plurality of switching elements 14 are constituted by IGBT, but all or a part of the plurality of switching elements 14 can be constituted by Metal-Oxide-Semiconductor Field-Effect Transistor (MOSFET).

The aforementioned first embodiment describes the case when cooling the semiconductor device 11 from both surfaces by the two cooling pipes 23,23 of the cooler 20, but the cooler constituted in order to cool only one surface of the semiconductor device 11 can be used in place of the cooler 20.

What is claimed is:

1. A semiconductor device comprising:
a plurality of switching elements electrically connected in parallel to each other; a plurality of recirculation elements electrically connected in parallel to the plurality of switching elements; and
a semiconductor module sealed with resin, the semiconductor module including:
at least two of the plurality of switching elements and at least two of the plurality of the recirculation elements; and
an emitter electrode serving as a reference potential of the plurality of switching elements and an anode electrode serving as a reference potential of the plurality of recirculation elements are electrically connected by a first single plate-like member comprising a conductive material, wherein:
the at least two switching elements are electrically connected in parallel and the at least two recirculation elements are electrically connected in parallel, and the at least two switching elements are electrically connected in parallel to the at least two recirculation elements on a lowest potential side in the semiconductor module sealed with resin;
the at least two switching elements and the at least two recirculation elements are positioned such that a first distance from an emitter terminal, which is connected to the emitter electrode via the plate-like member, to the recirculation element is no greater than a second distance from the emitter terminal to the switching elements, in a plan view;
a terminal extension member comprising a conductive material is provided extending from the single plate-like member;
the terminal extension member forms the emitter terminal; and
the terminal extension member extends from an end portion of the single plate-like member, the portion being closer to the recirculation elements than to the switching elements.

2. The semiconductor device according to claim 1, wherein at least of the two switching elements among the plurality of switching elements are arranged adjacent to each other along the plate surface of the plate-like member.

3. The semiconductor device according to claim 2, wherein the at least two switching elements adjacent to each other are arranged so that the respective element centers are positioned on the same virtual straight line.

4. The semiconductor device according to claim 1, wherein a gate electrode of the respective plurality of switching elements passes through a connection line interposed between the plurality of switching elements and the plate-like member to be electrically connected to a control part which controls the switching operation of the plurality of switching elements.

5. The semiconductor device according to claim 4, wherein a conductive spacer is interposed between the plurality of switching elements and the plate-like member, the spacer is electrically connected to the plurality of switching elements and the plate-like member, and is constituted so as to form a space for extracting a wire as the connection line from the respective gate electrode of the plurality of switching elements.

6. The semiconductor device according to claim 5, wherein the spacer is integrated with the plate-like member.

7. The semiconductor device according to claim 4, wherein the control circuit board of the control part comprises a pattern wiring interposed between the plurality of switching elements and the plate-like member, and uses the pattern wiring to constitute the connection line.

8. The semiconductor device according to claim 1, wherein the switching element and the recirculation element which are electrically connected in parallel are constituted as one composite element having the respective functions.

9. The semiconductor device according to claim 1, wherein all of the plurality of switching elements and the plurality of recirculation elements are constituted as one integrated semiconductor module.

10. The semiconductor device according to claim 1, wherein the plurality of switching elements and the plurality of recirculation elements are arranged in a plane in a virtual plane including the direction in which the emitter terminal extends.

11. The semiconductor device according to claim 1, wherein:
- a high potential side upper arm and a low potential side lower arm are connected in series between a high potential side line and a low potential side line of a power source;
- the upper arm comprises a plurality of sets of the switching element and the recirculation element electrically connected in parallel;
- the lower arm is provided with a plurality of sets of the switching element and the recirculation element electrically connected in parallel;
- the plurality of sets of the switching elements and the aforementioned recirculation element connected in parallel in the upper arm, and the plurality of sets of the switching elements and the recirculation elements connected in parallel in the lower arm constitute one semiconductor module sealed with resin; and
- each of the plurality of sets of the switching elements are electrically connected in parallel and the recirculation elements are electrically connected in parallel, and the at least two switching elements are electrically connected in parallel to the at least two recirculation elements pertaining to the lowest potential side lower arm among the semiconductor modules sealed with resin;
- the at least two switching elements and the at least two recirculation elements are positioned such that the first distance from a emitter terminal to the recirculation element is no greater than the second distance from the emitter terminal to the switching elements, in a plan view.

12. The semiconductor device according to claim 1, wherein the first distance is less than the second distance.

13. The semiconductor device according to claim 1, wherein
the terminal extension member extends in an extending direction along which the switching elements and the recirculation elements are arranged.

14. The semiconductor device according to claim 1, wherein
the single plate-like member forms a heat sink.

15. The semiconductor device according to claim 1, wherein
the terminal extension member is disposed to be closer to the recirculation elements than to the switching elements.

* * * * *